US012666930B2

(12) United States Patent
Jang et al.

(10) Patent No.: US 12,666,930 B2
(45) Date of Patent: Jun. 23, 2026

(54) SEMICONDUCTOR CHIP AND SEMICONDUCTOR PACKAGE WITH PLANAR SURFACES RECESS STRUCTURE AND LOWER DIELECTRIC ISOLATION

(71) Applicant: Samsung Electronics Co., Ltd., Suwon-si (KR)

(72) Inventors: Aenee Jang, Seoul (KR); Yoonsung Kim, Seoul (KR); Seungduk Baek, Hwaseong-si (KR); Yunrae Cho, Guri-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 820 days.

(21) Appl. No.: 17/839,675

(22) Filed: Jun. 14, 2022

(65) Prior Publication Data

US 2023/0086202 A1     Mar. 23, 2023

(30) Foreign Application Priority Data

Sep. 23, 2021     (KR) ........................ 10-2021-0125570

(51) Int. Cl.
*H01L 25/00*          (2006.01)
*H01L 21/48*          (2006.01)
          (Continued)

(52) U.S. Cl.
CPC ........... *H10P 74/273* (2026.01); *H10W 90/00* (2026.01); *H10W 72/923* (2026.01); *H10W 72/934* (2026.01); *H10W 90/792* (2026.01)

(58) Field of Classification Search
CPC . H01L 25/00–50; H01L 2225/00–1094; H01L 24/05; H01L 22/32; H01L 24/08;
          (Continued)

(56) References Cited

U.S. PATENT DOCUMENTS 9,082,808 B2      7/2015  Thacker et al.
9,502,391 B2 *   11/2016  Kwon ................. H01L 23/5389
                    (Continued)

FOREIGN PATENT DOCUMENTS

KR          100800135 B1      2/2008
KR        20170140985 A      12/2017
                    (Continued)

*Primary Examiner* — Leonard Chang
*Assistant Examiner* — Tsz K Chiu
(74) *Attorney, Agent, or Firm* — Wolf, Greenfield & Sacks, P.C.

(57)          ABSTRACT

A semiconductor package is provided. The semiconductor package includes, a base structure including a body, an upper pad on the body, and an upper insulating layer on a side surface of the upper pad, the base structure having a planar upper surface provided by the upper insulating layer and the upper pad; and a semiconductor chip on the planar upper surface of the base structure, and including a substrate, a wiring structure below the substrate, a low dielectric layer on a side surface of the wiring structure, a lower connection pad below the wiring structure, and a lower insulating layer on a side surface of the lower connection pad, the semiconductor chip having a planar lower surface provided by the lower insulating layer and the lower connection pad, a side surface provided by the lower insulating layer and the substrate, and a recess surface extending from one end of the side surface to one end of the planar lower surface, wherein the low dielectric layer is spaced apart from the recess surface of the semiconductor chip by the lower insulating layer.

20 Claims, 20 Drawing Sheets

(51) Int. Cl.
    *H01L 23/498*     (2006.01)
    *H10P 74/00*     (2026.01)
    *H10W 90/00*     (2026.01)
    *H10W 72/90*     (2026.01)

(58) Field of Classification Search
    CPC ....... H01L 25/0657; H01L 2224/05017; H01L 2224/08145; H01L 24/83; H01L 25/105; H01L 25/18; H01L 2225/1058; H01L 23/49816; H01L 24/16; H01L 23/3128; H01L 2224/32225; H01L 2224/16227; H01L 23/5389; H01L 23/49822; H01L 2224/73204; H01L 2225/06517; H01L 23/49838; H01L 24/32; H01L 2924/15311; H01L 2225/06541; H01L 2224/16225; H01L 2224/32145; H01L 25/50; H01L 24/73; H01L 24/20; H01L 2224/0401; H01L 2224/04105; H01L 2225/06513; H01L 2924/1431; H01L 24/13; H01L 21/4857; H01L 2224/05647; H01L 2224/12105; H01L 23/13; H01L 23/5383; H01L 24/19; H01L 2225/1035; H01L 2225/1041; H01L 23/481; H01L 23/5386; H01L 2225/0651; H01L 21/6835; H01L 2224/48227; H01L 2225/06586; H01L 24/48; H01L 2924/181; H01L 23/49827; H01L 2221/68345; H01L 2224/13147; H01L 2224/16145; H01L 2224/73265; H01L 2924/3511; H01L 2224/05624; H01L 25/0652; H01L 21/4853; H01L 2225/06562; H01L 21/561; H01L 23/5384; H01L 23/562; H01L 24/17; H01L 2924/1436; H01L 2224/16238; H01L 2225/06589; H01L 23/49833; H01L 23/49894; H01L 24/06; H01L 24/09; H01L 21/568; H01L 2224/02379; H01L 2224/05124; H01L 2224/05147; H01L 2224/05684; H01L 2224/13111; H01L 2224/73267; H01L 2225/06524; H01L 23/49811; H01L 23/5385; H01L 24/03; H01L 2224/05166; H01L 2224/131; H01L 2224/16237; H01L 2224/80895; H01L 2924/1434; H01L 2924/19105; H01L 2224/13139; H01L 2224/80896; H01L 2224/92244; H01L 2225/06565; H01L 24/11; H01L 24/80; H01L 24/96; H01L 21/486; H01L 21/76898; H01L 2224/0557; H01L 2224/13025; H01L 2224/214; H01L 2224/2929; H01L 2225/06506; H01L 23/5226; H01L 2924/1815; H01L 2924/3025; H01L 21/563; H01L 21/565; H01L 2224/05557; H01L 2224/13082; H01L 2224/17181; H01L 2224/18; H01L 2224/48145; H01L 23/3114; H01L 23/36; H01L 23/552; H01L 2224/05541; H01L 2224/05666; H01L 2224/73253; H01L 2224/92125; H01L 2225/1023; H01L 23/564; H01L 24/81; H01L 2924/0002; H01L 2924/15153; H01L 2924/18161; H01L 2924/19041; H01L 2924/19042; H01L 2221/68359; H01L 2224/05187; H01L 2224/05655; H01L 2224/05669; H01L 2224/05681; H01L 2224/05687; H01L 2224/08235; H01L 2224/48091; H01L 2225/06548; H01L 2225/06568; H01L 23/3121; H01L 23/3135; H01L 23/3171; H01L 25/16; H01L 21/76801; H01L 21/76804; H01L 21/76819; H01L 21/7684; H01L 21/78; H01L 2224/05578; H01L 2224/05639; H01L 2224/05644; H01L 2224/06181; H01L 2224/13101; H01L 2224/13144; H01L 2224/13155; H01L 2224/13169; H01L 2224/16235; H01L 2224/81001; H01L 2224/83001; H01L 2224/96; H01L 23/3107; H01L 23/3192; H01L 23/49866; H01L 23/585; H01L 24/14; H01L 2924/07802; H01L 2924/15192; H01L 2924/18162; H01L 2924/3512; H01L 2224/05082; H01L 2224/05184; H01L 2224/05572; H01L 2224/0903; H01L 2224/13166; H01L 2224/2518; H01L 2224/80203; H01L 2224/83101; H01L 2225/06527; H01L 23/31; H01L 23/3157; H01L 24/24; H01L 24/45; H01L 24/94; H01L 2924/1432; H01L 2924/1433; H01L 2924/182; H01L 21/76802; H01L 21/76877; H01L 2223/54426; H01L 2224/02331; H01L 2224/02377; H01L 2224/05008; H01L 2224/05022; H01L 2224/05551; H01L 2224/05567; H01L 2224/05569; H01L 2224/05657; H01L 2224/05676; H01L 2224/05686; H01L 2224/0801; H01L 2224/08059; H01L 2224/08147; H01L 2224/10175; H01L 2224/13023; H01L 2224/13099; H01L 2224/13124; H01L 2224/13176; H01L 2224/13181; H01L 2224/13184; H01L 2224/13186; H01L 2224/1403; H01L 2224/1411; H01L 2224/14181; H01L 2224/33181; H01L 2224/45147; H01L 2224/80006; H01L 2224/81; H01L 2224/81447; H01L 2224/81801; H01L 2225/06544; H01L 2225/1088; H01L 23/145; H01L 23/367; H01L 23/3675; H01L 23/42; H01L 23/4275; H01L 23/5283; H01L 23/544; H01L 24/02; H01L 24/29; H01L 24/33; H01L 24/97; H01L 25/0655; H01L 2924/00014; H01L 2924/01029; H01L 2924/10329; H01L 2924/1304; H01L 2924/15156; H01L 2924/15174; H01L 2924/19043; H01L 2221/68368; H01L 2223/5442; H01L 2223/54486; H01L 2224/0239; H01L 2224/03002; H01L 2224/0346; H01L 2224/03602; H01L 2224/03616; H01L 2224/0362; H01L 2224/03901; H01L 2224/0391; H01L 2224/04042; H01L 2224/05005; H01L 2224/05011; H01L 2224/05024; H01L 2224/05078; H01L 2224/05155; H01L 2224/05181; H01L 2224/05556; H01L 2224/05571; H01L 2224/05573; H01L 2224/05582; H01L 2224/0603; H01L 2224/06155; H01L 2224/08146; H01L 2224/08225; H01L 2224/1147; H01L 2224/13021; H01L 2224/14135; H01L 2224/16146; H01L 2224/16148; H01L 2224/1703; H01L 2224/19; H01L 2224/2101; H01L 2224/215; H01L
2224/221; H01L 2224/24146; H01L
2224/3201; H01L 2224/45139; H01L
2224/45144; H01L 2224/48147; H01L
2224/73251; H01L 2224/73259; H01L
2224/8083; H01L 2224/81411; H01L
2224/81439; H01L 2224/81444; H01L
2224/81455; H01L 2224/81815; H01L
2224/82039; H01L 2224/92124; H01L
2224/95001; H01L 2225/06555; H01L
2225/06572; H01L 2225/1094; H01L
23/14; H01L 23/3185; H01L 23/34; H01L
24/27; H01L 24/49; H01L 24/82; H01L
24/85; H01L 2924/01013; H01L
2924/01047; H01L 2924/01073; H01L
2924/01074; H01L 2924/01078; H01L
2924/01079; H01L 2924/12042; H01L
2924/14; H01L 2924/1437; H01L
2924/37001; H01L 21/0274; H01L
21/31144; H01L 21/56; H01L 2223/6677;
H01L 2224/02166; H01L 2224/02185;
H01L 2224/02245; H01L 2224/0225;
H01L 2224/02333; H01L 2224/0236;
H01L 2224/02372; H01L 2224/03462;
H01L 2224/03472; H01L 2224/05009;
H01L 2224/05025; H01L 2224/05073;
H01L 2224/05111; H01L 2224/05113;
H01L 2224/05116; H01L 2224/05117;
H01L 2224/05118; H01L 2224/05123;
H01L 2224/05138; H01L 2224/05144;
H01L 2224/05149; H01L 2224/05157;
H01L 2224/05163; H01L 2224/05164;
H01L 2224/05169; H01L 2224/0517;
H01L 2224/05171; H01L 2224/05173;
H01L 2224/05176; H01L 2224/0518;
H01L 2224/05183; H01L 2224/05186;
H01L 2224/05552; H01L 2224/05554;
H01L 2224/05558; H01L 2224/05599;
H01L 2224/06102; H01L 2224/11849;
H01L 2224/13005; H01L 2224/13014;
H01L 2224/13109; H01L 2224/13113;
H01L 2224/13116; H01L 2224/13118;
H01L 2224/1312; H01L 2224/13164;
H01L 2224/1415; H01L 2224/14155;
H01L 2224/14156; H01L 2224/14177;
H01L 2224/14517; H01L 2224/16113;
H01L 2224/16147; H01L 2224/17151;
H01L 2224/17183; H01L 2224/17517;
H01L 2224/20; H01L 2224/211; H01L
2224/24105; H01L 2224/24195; H01L
2224/24226; H01L 2224/26175; H01L
2224/27013; H01L 2224/2784; H01L
2224/29099; H01L 2224/32058; H01L
2224/32059; H01L 2224/32245; H01L
2224/45124; H01L 2224/45155; H01L
2224/45157; H01L 2224/45164; H01L
2224/45166; H01L 2224/45169; H01L
2224/45171; H01L 2224/4801; H01L
2224/48225; H01L 2224/48228; H01L
2224/49175; H01L 2224/73215; H01L
2224/73257; H01L 2224/81191; H01L
2224/81399; H01L 2224/83102; H01L
2224/83191; H01L 2224/83385; H01L
2224/85001; H01L 2224/97; H01L
2225/06537; H01L 2225/06558; H01L
2225/06582; H01L 2225/06593; H01L
23/053; H01L 23/10; H01L 23/12; H01L
23/291; H01L 23/3142; H01L 23/3677;
H01L 23/485; H01L 23/49586; H01L
23/525; H01L 23/528; H01L 23/66; H01L
24/18; H01L 24/23; H01L 24/26; H01L
24/42; H01L 24/92; H01L 25/11; H01L
2924/00013; H01L 2924/01004; H01L
2924/01005; H01L 2924/01006; H01L
2924/01019; H01L 2924/01023; H01L
2924/0103; H01L 2924/01032; H01L
2924/01033; H01L 2924/01042; H01L
2924/01046; H01L 2924/01082; H01L
2924/01322; H01L 2924/014; H01L
2924/10157; H01L 2924/10252; H01L
2924/10253; H01L 2924/10391; H01L
2924/1441; H01L 2924/1443; H01L
2924/145; H01L 2924/1461; H01L
2924/15151; H01L 2924/15313; H01L
2924/1811; H01L 2924/186; H01L
2924/19106; H01L 21/2855; H01L
21/31055; H01L 21/31111; H01L 21/481;
H01L 21/4871; H01L 21/6836; H01L
21/76871; H01L 21/76879; H01L
2223/54406; H01L 2223/54433; H01L
2223/5448; H01L 2224/02371; H01L
2224/02381; H01L 2224/0361; H01L
2224/03845; H01L 2224/05007; H01L
2224/05012; H01L 2224/05015; H01L
2224/05018; H01L 2224/05547; H01L
2224/05548; H01L 2224/05553; H01L
2224/05555; H01L 2224/05562; H01L
2224/05576; H01L 2224/06051; H01L
2224/06132; H01L 2224/06133; H01L
2224/08058; H01L 2224/08111; H01L
2224/08113; H01L 2224/08148; H01L
2224/08238; H01L 2224/09051; H01L
2224/09055; H01L 2224/09515; H01L
2224/11; H01L 2224/1134; H01L
2224/11462; H01L 2224/13; H01L
2224/13008; H01L 2224/13022; H01L
2224/13024; H01L 2224/13083; H01L
2224/1357; H01L 2224/13647; H01L
2224/14131; H01L 2224/14132; H01L
2224/16012; H01L 2224/16013; H01L
2224/16054; H01L 2224/2105; H01L
2224/24147; H01L 2224/24225; H01L
2224/24227; H01L 2224/26145; H01L
2224/27001; H01L 2224/27312; H01L
2224/3003; H01L 2224/45005; H01L
2224/4502; H01L 2224/45099; H01L
2224/46; H01L 2224/48105; H01L
2224/48108; H01L 224/48111; H01L
2224/48148; H01L 2224/48229; H01L
2224/48247; H01L 2224/48496; H01L
2224/48499; H01L 2224/48996; H01L
2224/48997; H01L 2224/49109; H01L
2224/49171; H01L 2224/73209; H01L
2224/8114; H01L 2224/81193; H01L
2224/81385; H01L 2224/81416; H01L
2224/81424; H01L 2224/81466; H01L
2224/82; H01L 2224/83193; H01L
2224/8349; H01L 2224/8359; H01L
2224/83688; H01L 2224/8385; H01L
2224/83862; H01L 2224/85; H01L 2224/94; H01L 2224/95; H01L 2225/0652; H01L 2225/1052; H01L 2225/107; H01L 2225/1082; H01L 23/00; H01L 23/147; H01L 23/16; H01L 23/293; H01L 23/3178; H01L 23/3672; H01L 23/373; H01L 23/3731; H01L 23/3735; H01L 23/3737; H01L 23/49582; H01L 23/50; H01L 23/5381; H01L 24/30; H01L 24/46; H01L 24/95; H01L 25/065; H01L 25/074; H01L 25/165; H01L 25/167; H01L 2924/01022; H01L 2924/01028; H01L 2924/0105; H01L 2924/04941; H01L 2924/04953; H01L 2924/10156; H01L 2924/10158; H01L 2924/14361; H01L 2924/1438; H01L 2924/14511; H01L 2924/152; H01L 2924/171; H01L 2924/1715; H01L 2924/18301; H01L 2924/35121; H01L 2924/3656; H01L 2924/37; H01L 2924/381; H01L 2924/3841; H01L 2924/386; H10B 80/00; H10K 19/901; H10K 39/601; H10K 59/90–95; H10N 19/00–101; H10N 39/00; H10N 59/00; H10N 69/00; H10N 79/00; H10N 89/00

See application file for complete search history.

(56) References Cited

U.S. PATENT DOCUMENTS

| | | | |
|---|---|---|---|
| 9,768,098 B2 | 9/2017 | Lohia et al. | |
| 10,157,892 B1 * | 12/2018 | Chen | H01L 21/6835 |
| 10,504,873 B1 * | 12/2019 | Chen | H01L 24/09 |
| 10,910,346 B2 | 2/2021 | Hong et al. | |
| 2008/0203581 A1 * | 8/2008 | Thomas | H01L 23/4334 257/E23.092 |
| 2013/0157414 A1 | 6/2013 | Ho et al. | |
| 2016/0148918 A1 * | 5/2016 | Ye | H01L 24/04 438/107 |
| 2017/0062367 A1 * | 3/2017 | Jo | H01L 24/05 |
| 2017/0358558 A1 | 12/2017 | Lee | |
| 2019/0096868 A1 * | 3/2019 | Tsou | H01L 23/295 |
| 2019/0131276 A1 * | 5/2019 | Chen | H01L 24/19 |
| 2020/0135636 A1 | 4/2020 | Lee et al. | |
| 2020/0135698 A1 | 4/2020 | Hong et al. | |
| 2020/0411483 A1 * | 12/2020 | Uzoh | H01L 24/97 |
| 2021/0057328 A1 | 2/2021 | Lee et al. | |
| 2021/0143102 A1 | 5/2021 | Ko et al. | |

FOREIGN PATENT DOCUMENTS

| | | | |
|---|---|---|---|
| KR | 20200047849 A | 5/2020 | |
| KR | 20200048771 A | 5/2020 | |
| KR | 20210022402 A | 3/2021 | |
| KR | 20210055164 A | 5/2021 | |
| WO | 2020091214 A1 | 5/2020 | |

* cited by examiner

SEMICONDUCTOR CHIP AND SEMICONDUCTOR PACKAGE WITH PLANAR SURFACES RECESS STRUCTURE AND LOWER DIELECTRIC ISOLATION

CROSS-REFERENCE TO RELATED APPLICATION

This application claims the priority and benefit of Korean Patent Application No. 10-2021-0125570, filed on Sep. 23, 2021, with the Korean Intellectual Property Office, the inventive concept of which is incorporated herein by reference.

BACKGROUND

1 Field

The present inventive concept relates to a semiconductor chip and a semiconductor package.

2. Description of Related Art

As the demand for high capacitance, thinness, and miniaturization of electronic products increases, various types of semiconductor packages are being developed. Recently, as a method to integrate more components (e.g., semiconductor chips) into a package structure, a direct bonding technology for bonding semiconductor chips without an adhesive film (e.g., NCF) or a connection bump (e.g., a solder ball) has been developed.

SUMMARY

An aspect of the present inventive concept is to provide a semiconductor chip in which burrs protruding onto a bonding surface are reduced.

An aspect of the present inventive concept is to provide a semiconductor package in which void defects are minimized while a yield is improved during direct bonding.

According to an aspect of the present inventive concept, a semiconductor package is provided. The semiconductor package includes, a base structure including a body, an upper pad on the body, and an upper insulating layer on a side surface of the upper pad, the base structure having a planar upper surface provided by the upper insulating layer and the upper pad; and a semiconductor chip on the upper surface of the base structure, and including a substrate, a wiring structure below the substrate, a low dielectric layer on a side surface of the wiring structure, a lower connection pad below the wiring structure, and a lower insulating layer on a side surface of the lower connection pad, the semiconductor chip having a planar lower surface provided by the lower insulating layer and the lower connection pad, a side surface provided by the lower insulating layer and the substrate, and a recess surface extending from one end of the side surface to one end of the lower surface, wherein the low dielectric layer is spaced apart from the recess surface of the semiconductor chip by the lower insulating layer.

According to an aspect of the present inventive concept, a semiconductor package is provided. The semiconductor package includes: a base structure including an upper pad and an upper insulating layer on a side surface of the upper pad; and a semiconductor chip on the base structure, and including a substrate, a wiring structure below the substrate, a low dielectric layer on a side surface of the wiring structure, a lower connection pad below the wiring structure, and a lower insulating layer on a side surface of the lower connection pad, the semiconductor chip having a lower surface provided by the lower insulating layer and the lower connection pad, a side surface provided by the lower insulating layer and the substrate, and a recess surface extending from one end of the side surface to one end of the lower surface, wherein the recess surface includes a first surface recessed in a direction from the lower surface toward the substrate, and a second surface extending from the one end of the lower surface to the first surface, wherein the lower insulating layer extends between the first surface and the substrate.

According to an aspect of the present inventive concept, a semiconductor package is provided. The semiconductor package includes: a first semiconductor chip including a first substrate, a first upper connection pad on the first substrate, and a first upper insulating layer on a side surface of the first upper connection pad, the first semiconductor chip having a first upper surface provided by the first upper insulating layer and the first upper connection pad, and a first side surface provided by the first upper insulating layer; and a second semiconductor chip on the first upper surface of the first semiconductor chip, and including a second substrate, a second lower connection pad below the second substrate and facing the first upper connection pad, and a second lower insulating layer on a side surface of the second lower connection pad, the second semiconductor chip having a second lower surface provided by the second lower connection pad and the second lower insulating layer, a second side surface provided by the second lower insulating layer, and a lower recess surface extending from one end of the second side surface to one end of the second lower surface, wherein the lower recess surface is spaced apart from the second substrate.

According to an aspect of the present inventive concept, a semiconductor chip is provided. The semiconductor chip includes: a substrate having a front surface and a rear surface opposing each other; a circuit layer on the front surface of the substrate, and including a wiring structure and a low dielectric layer on a side surface of the wiring structure; and a front structure below the circuit layer, and including a lower connection pad electrically connected to the wiring structure, and a lower insulating layer on a side surface of the lower connection pad and the lower dielectric layer, the semiconductor chip having a planar lower surface provided by the lower insulating layer and the lower connection pad, a side surface provided by the lower insulating layer and the substrate, and a recess surface provided by the lower insulating layer and stepped inwardly from the lower surface and the side surface, respectively.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1A:
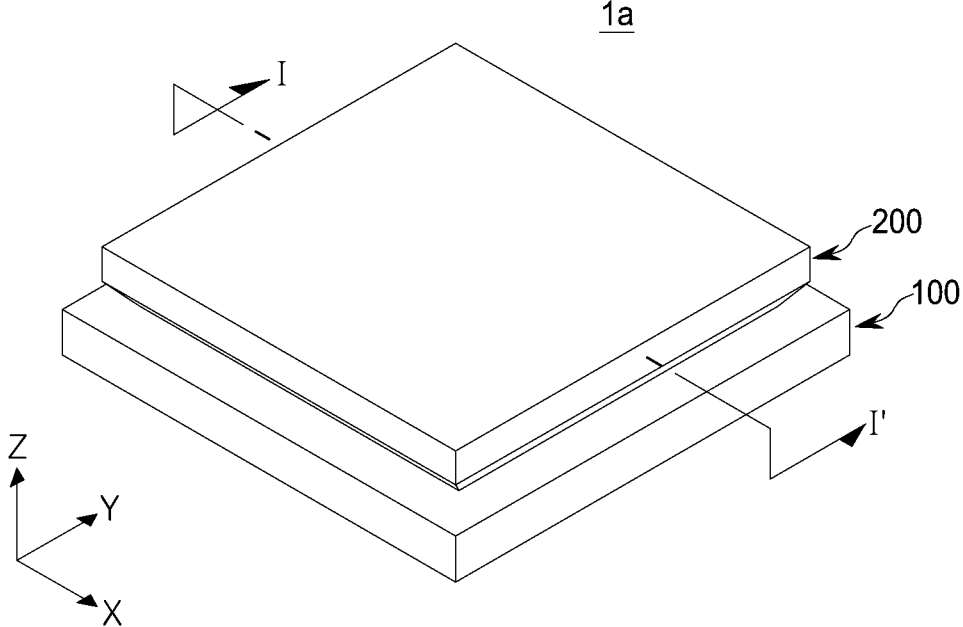
FIG. 1A is a perspective view illustrating a semiconductor package according to an example embodiment of the present inventive concept.
Figure 1B:
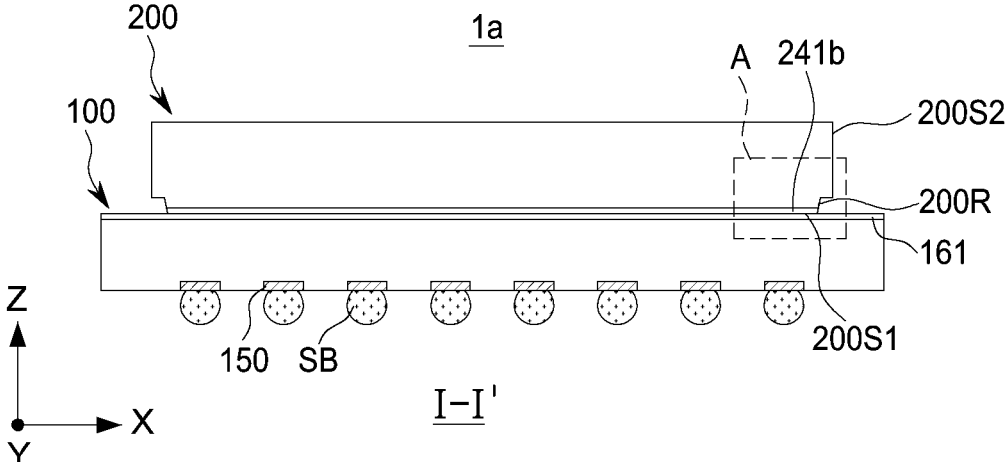
FIG. 1B is a cross-sectional view illustrating a cross-section taken along line I-I' of FIG. 1A.
Figure 1C:
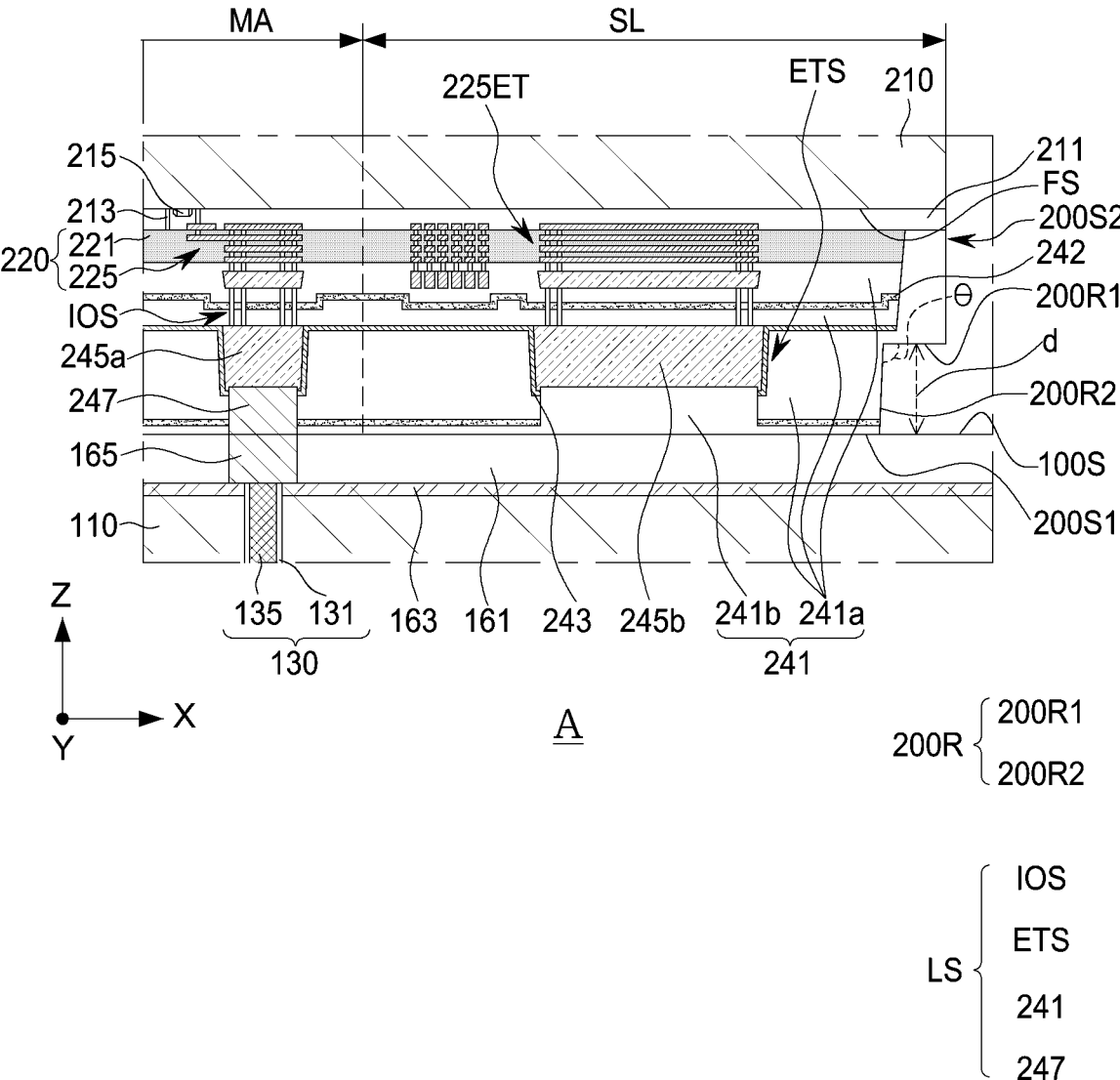
FIG. 1C is a partially enlarged view illustrating a region 'A' of FIG. 1A.

FIG. 1A is a perspective view illustrating a semiconductor package 1a according to an example embodiment of the present inventive concept, FIG. 1B is a cross-sectional view taken along line I-I' in FIG. 1A, and FIG. 1C is a partially enlarged view illustrating a region 'A' of FIG. 1A.

Referring to FIGS. 1A and 1B, a semiconductor package 1a according to an example embodiment may include a base structure 100 and a semiconductor chip 200 stacked in a vertical direction (Z-axis direction). In the present example embodiment, the base structure 100 and the semiconductor chip 200 may have a structure in which elements exposed to an upper surface of the base structure 100 and a lower surface of the semiconductor chip 200 are directly bonded and coupled (for example, by hybrid bonding, direct bonding, or the like), without a separate connection member (e.g., a metal pillar, a solder bump, an adhesive film, or the like). For example, an upper insulating layer 161 providing an upper surface of the base structure 100 and a lower insulating layer 241b providing a lower surface of the semiconductor chip 200 may be directly bonded on a bonding surface of the base structure 100 and the semiconductor chip 200.

The base structure 100 is a semiconductor wafer-based structure, and may be, for example, a silicon interposer substrate, a semiconductor chip, or the like. When the base structure 100 is a semiconductor chip, the base structure 100 and the semiconductor chip 200 may be chiplets constituting a multi-chip module (MCM). In this case, the number of semiconductor chips 200 stacked vertically or horizontally on the base structure 100 may be two or more. For example, the plurality of semiconductor chips 200 on the base structure 100 may include I/O, CPU, GPU, and Field Programmable Gate Array (FPGA) chips, and the like, and the base structure 100 may be an active interposer performing a function of an I/O chip, and in this case, an I/O device, a DC/DC converter, a sensor, a test circuit, and the like may be included therein. For example, the base structure 100 may be a logic chip including a central processor (CPU), a graphics processor (GPU), a field programmable gate array (FPGA), an application processor (AP), a digital signal processor (DSP), an encryption processor, a microprocessor, a microcontroller, an analog-digital converter, an application-specific IC (ASIC), or the like, and the semiconductor chip 200 may be a memory chip such as DRAM, SRAM, PRAM, MRAM, FeRAM, or RRAM. A lower pad 150 and a connection bump SB may be below the base structure 100. The connection bump SB is illustrated in a form of a solder ball, but an embodiment thereof is not limited thereto, and may have a form of a copper pillar or a form in which a copper pillar and a solder ball are combined. According to an example embodiment, the connection bumps SB are omitted and a lower surface of the base structure 100 may form direct bonding with other structures, and in this case, a recess surface may be introduced into the base structure 100, similarly to the semiconductor chip 200.

The semiconductor chip 200 may include a logic chip or a memory chip, and a larger number of semiconductor chips than shown in the drawing may be stacked in a vertical direction (Z-axis direction) or a horizontal direction (X-axis or Y-axis direction) on the base structure 100. In the present inventive concept, a step difference, for example, by forming a recess surface 200R, stepped with a lower surface 200S1 and a side surface 200S2, respectively, at an edge of a bonding surface of the semiconductor chip 200 forming direct bonding, it is possible to reduce or prevent burrs generated in a cutting process (e.g., wafer dicing process) of the chip 200 from protruding to the bonding surface, and as a result, it is possible to provide a planar lower surface 200S1 for stably forming direct bonding, and it is possible to minimize void defects of the semiconductor package 1a and improve the process yield. In addition, in the present inventive concept, by providing the recess surface 200R using specific components of the semiconductor chip 200, the semiconductor chip 200 is capable of minimizing damages to an internal circuit layer (refer to "220" in FIG. 1C) of the semiconductor chip 200 in the wafer dicing process and stably forming direct bonding may be provided.

Hereinafter, each component constituting the bonding surface of the base structure 100 and the semiconductor chip 200 will be described in detail with reference to FIG. 1C.

As illustrated in FIG. 1C, the base structure 100 may include a body 110, an upper pad 165 on the body 110, and an upper insulating layer 161 surrounding or on a side surface of the upper pad 165. The base structure 100 may have a planar upper surface 100S provided by the upper insulating layer 161 and the upper pad 165. In addition, the base structure 100 may further include a through electrode 130 extending through a lower pad ("150" of FIG. 1B) below the body 110 and the upper pad 165 to electrically connect the lower pad 150 and the upper pad 165, and an insulating protective layer 163 between the body 110 and the upper insulating layer 161.

The body 110 may include a semiconductor element such as silicon, germanium, or a semiconductor wafer including a compound semiconductor such as silicon carbide (SiC), gallium arsenide (GaAs), indium arsenide (InAs), and indium phosphide (InP). The body 110 may have an active surface having an active region doped with an impurity and an inactive surface opposing the active region.

The upper pad 165 and the upper insulating layer 161 may be on one surface of the body 110 and provide an upper surface 100S bonded to the semiconductor chip 200. The upper pad 165 may include a conductive material that may be bonded and coupled to the lower connection pad 247 of the semiconductor chip 200, for example, any one of copper (Cu), nickel (Ni), gold (Au), or silver (Ag) or an alloy thereof. The upper insulating layer 161 may include an insulating material that can be bonded and coupled to the lower insulating layer 241 of the semiconductor chip 200 while surrounding a side surface of the upper pad 165, for example, silicon oxide (SiO) or silicon carbonitride (SiCN). An insulating protective layer 163 electrically insulating the upper pad 165 and the body 110 may be between the upper pad 165 and the body 110. The insulating protective layer 163 may include silicon oxide, silicon nitride, silicon carbide, silicon oxynitride, or silicon carbonitride.

The through electrode 130 may extend through the body 110 and the insulating protective layer 164 to electrically connect the upper pad 165 and the lower pad 150. The through electrode 130 may include a via plug 135 and a side insulating film 131 surrounding a side surface of the via plug 135. The side insulating film 131 may electrically separate the via plug 135 from the body 110. The via plug 135 may include, for example, tungsten (W), titanium (Ti), aluminum (Al), or copper (Cu), and may be formed by a plating process, a PVD process, or a CVD process. The side insulating film 131 may include a metal compound such as tungsten nitride (WN), titanium nitride (TiN), or tantalum nitride (TaN), and may be formed by a PVD process or a CVD process.

The semiconductor chip 200 may be on an upper surface 100S of the base structure 100, and may include a substrate 210, a circuit layer 220, and a front structure LS. In addition, the semiconductor chip 200 may have a planar lower surface 200S1 provided by the lower insulating layer 241 and the lower connection pad 247, a side surface 200S2 provided by the lower insulating layer 241 and the substrate 210, and a recess surface 200R extending from one end of the side surface 200S2 to one end of the lower surface 200R1.

The substrate 210 may have a front surface FS having an active region and a rear surface opposite the front surface FS. Individual elements 215 such as transistors may be formed on the front surface FS of the substrate 210. An interlayer insulating film 211 covering the individual elements 215 may be formed on the front surface FS of the substrate, and the individual elements 215 may be connected to a wiring structure 225 of the circuit layer 220 by an interconnection portion 213 (e.g., a contact plug). The interlayer insulating film 211 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), and Plasma Enhanced Tetra Ethyl Ethyl (PETEOS). Ortho Silicate), Fluoride Silicate Glass (FSG), High Density Plasma (HDP) oxide, Plasma Enhanced Oxide (PEOX), Flowable CVD (FCVD) oxide, or a combination thereof. The individual elements 215 may include FETs such as planar FETs or FinFETs, memory devices such as a flash memory, DRAM, SRAM, EEPROM, PRAM, MRAM, FeRAM, and RRAM, logic devices such as AND, OR, NOT, and various active elements and/or passive elements such as system LSI, CIS, and MEMS.

The circuit layer 220 may include a wiring structure 225 forming an integrated circuit on the front surface FS of the substrate 210 and a low dielectric layer 221 surrounding or on a side surface of the wiring structure 225.

The wiring structure 225 may electrically connect an input/output structure IOS or the input/output pad 245a to the individual elements 215 and the active region of the substrate 210, or interconnect the individual elements 215. The wiring structure 225 may include an electrical test structure (ETS) or a test wiring structure 225ET connecting the test pad 245b to an electrical test circuit. The wiring structure 225 may be formed in a multilayer structure including wiring patterns and wiring vias, may include a metal material, for example, aluminum (Al), gold (Au), cobalt (Co), copper (Cu), nickel (Ni), lead (Pb), tantalum (Ta), tellurium (Te), titanium (Ti), tungsten (W), or a combination thereof.

The low dielectric layer 221 may include a material having a lower dielectric constant than that of the lower insulating layer 241. For example, the low-k layer 221 may be formed of fluorine doped silicon oxide, carbon doped silicon oxide, spin-on silicone based polymer, or a porous layer. For example, fluorine doped silicon oxide may be SiOF, carbon doped silicon oxide may be SiOC, and spin-on silicon-based polymer polymer may be hydrogen silsesquioxane (HSQ), methylsilsesqioxane (MSQ), a poly-tetrafluoroethylene (PTFE) layer, fluorinated poly-aryl-ether (FLARE), poly-paraxylylene, benzo cyclobutene (BCB), silicon low-K polymer (SILK), or the like. In addition thereto, the low dielectric layer 221 may include various materials having a lower dielectric constant than that of the lower insulating layer 241. In the present inventive concept, since a formation region of the recess surface 200R is limited to a region within the lower insulating layer 241, the low dielectric layer 221 may be spaced apart from the recess surface 200R and the side surface 200S2 of the semiconductor chip 200 and may not be exposed thereto. Accordingly, the side surface 200S2 of the semiconductor chip 200 may be provided only by the lower insulating layer 241 and the substrate 210, thereby preventing damage to the circuit layer 220 in the wafer dicing process and stably direct bonding and forming a planar lower surface 20051 for stably forming direct bonding.

The front structure LS may include an input/output structure IOS, an electrical test structure ETS, a lower connection pad 247, and a lower insulating layer 241.

The input/output structure IOS and the electrical inspection structure ETS may be below a wiring structure 225 and a test wiring structure 225ET, respectively. The test wiring structure 225ET may be between the side surface 200S2 of the semiconductor chip 200 and the wiring structure 225. That is, the input/output structure IOS may be located in a main region MA in which an integrated circuit is formed, and the electrical test structure ETS may be located in the scribe lane SL. The input/output structure IOS and the electrical test structure ETS may be an integral conductive structure including an input/output pad 245a and a test pad 245b, respectively. The electrical test structure ETS may be electrically insulated from the input/output structure IOS. The input/output structure IOS and the electrical test structure ETS may be electrically connected to a wiring structure 225 of the circuit layer 220, and may include, for example, aluminum (Al) or an aluminum (Al) alloy. The input/output pad 245a and the test pad 245b may be on substantially the same level in the lower insulating layer 241 and may be covered by a capping barrier film 243. The capping barrier film 243 may include at least one of, for example, silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC). The test pad 245b may be covered by an insulating layer after an electrical test is completed. For example, as shown in the drawings, a lower surface of the test pad 245*b* may be covered by the lower insulating layer 241.

The lower connection pad 247 and the lower insulating layer 241 may be on the front surface FS of the substrate 210 and provide a lower surface 200S1 bonded to the upper surface 100S of the base structure 100. The lower connection pad 247 may be below a wiring structure 225 and the input/output structure IOS, and may include a material for bonding and coupling to the upper pad 165 of the base structure, and may include, at least one of, for example, copper (Cu), nickel (Ni), gold (Au), and silver (Ag), or an alloy thereof. The lower insulating layer 241 may include an insulating material surrounding a side surface of the lower connection pad 247, the input/output structures (IOS), and the electrical test structures (ETS), and capable of being bonded and coupled to the upper insulating layer 161 of the base structure 100, may include, for example, silicon oxide (SiO) or silicon carbonitride (SiCN). The lower insulating layer 241 may be formed by stacking different insulating materials. For example, an insulating barrier film 242 may be between insulating material layers constituting the lower insulating layer 241. The insulating barrier film 242 may include silicon nitride, silicon carbide, silicon oxynitride, or silicon carbonitride.

Meanwhile, to facilitate understanding of the structure and manufacturing process of the front structure LS, it is illustrated that the lower insulating layer 241 is divided into a first lower insulating layer 241*a* and a second lower insulating layer 241*b*, however, a boundary between the first lower insulating layer 241*a* and the second lower insulating layer 241*b* may not be clearly distinguished. The lower insulating layer 241 may extend from an edge of the semiconductor chip 200 along a side surface of the low dielectric layer 221 to be in contact with the substrate 210 or the interlayer insulating film 211. Accordingly, the lower insulating layer 241 may block the low dielectric layer 221 from being exposed to the side surface 200S2 and the recess surface 200R of the semiconductor chip 200.

According to the present inventive concept, a recess surface 200R, stepped inwardly from the lower surface 200S1 and the side surface 200S2, respectively, at an edge of a bonding surface of the semiconductor chip 200 for forming direct bonding, so that it is possible to reduce or prevent burrs that protrude into the bonding surface, and as a result, direct bonding may be formed. For example, the recess surface 200R may include a first surface 200R1 recessed in a direction from the lower surface 200S1 toward the substrate 210, and a second surface 200R2 extending from one end of the lower surface 200S1 to the first surface 200R1. Both the first surface 200R1 and the second surface 200R2 may be provided by the lower insulating layer 241, and both of the first surface 200R1 and the second surface 200R2 may be planar surfaces on which the lower insulating layer 241 is etched. When the recess surface 200R is formed by a drying or wet etching process without forming the recess surface 200R using a blade or a laser, burrs generated during a formation process of the recess surface 200R may be controlled (see FIGS. 7D and 8D). The first surface 200R1 may be on a level between the lower surface 200S1 of the semiconductor chip 200 and the front surface FS of the substrate 210, and a lower insulating layer 241 may extend between the first surface 200R1 and the substrate 210. For example, the first surface 200R1 may extend from one end of the side surface 200S2 of the semiconductor chip 200 in a direction parallel to the lower surface 200S1 (X-axis or Y-axis direction). The first surface 200R1 may have a considerable depth so that burrs generated during a cutting process of the semiconductor chip 200 do not protrude to the lower surface 200S1. Accordingly, a separation distanced from the lower surface 200R1 of the semiconductor chip 200 to the first surface 200R1 may have a range of about 5 μm or more, for example, about 5 μm to about 20 μm, or about 5 μm to 15 μm. For example, burrs generated in a dicing process may exist on the first surface 200R1. A depth of the first surface 200R1 or the recess surface 200R may vary depending on process conditions and is not limited to the above numerical range. The second surface 200R2 may extend at a predetermined angle with respect to the first surface 200R1. An angle between the second surface 200R2 and the first surface 200R1 may have a range of about 90 or more, for example, in a range of about 90 degrees to about 130 degrees, about 90 degrees to about 110 degrees, about 90 degrees to about 100 degrees. The angle between the second surface 200R2 and the first surface 200R1 may vary depending on a depth of the recess surface 200R and is not limited to the above numerical range.

Figure 2A:
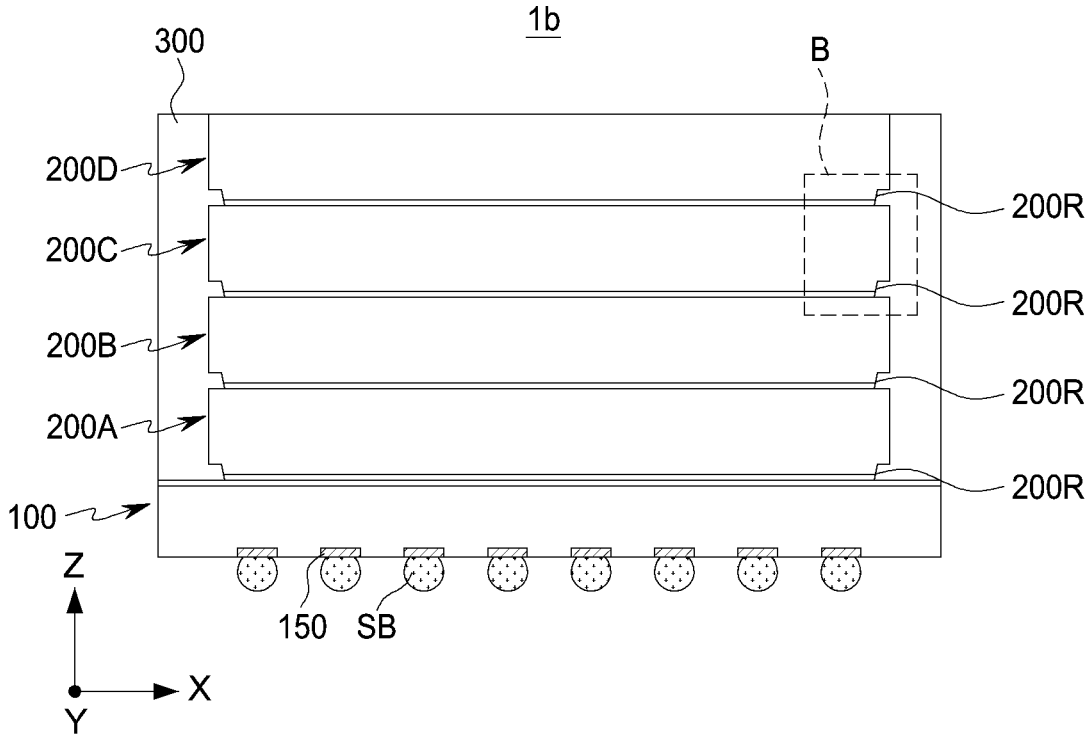
FIG. 2A is a cross-sectional view illustrating a semiconductor package according to an example embodiment of the present inventive concept.
Figure 2B:
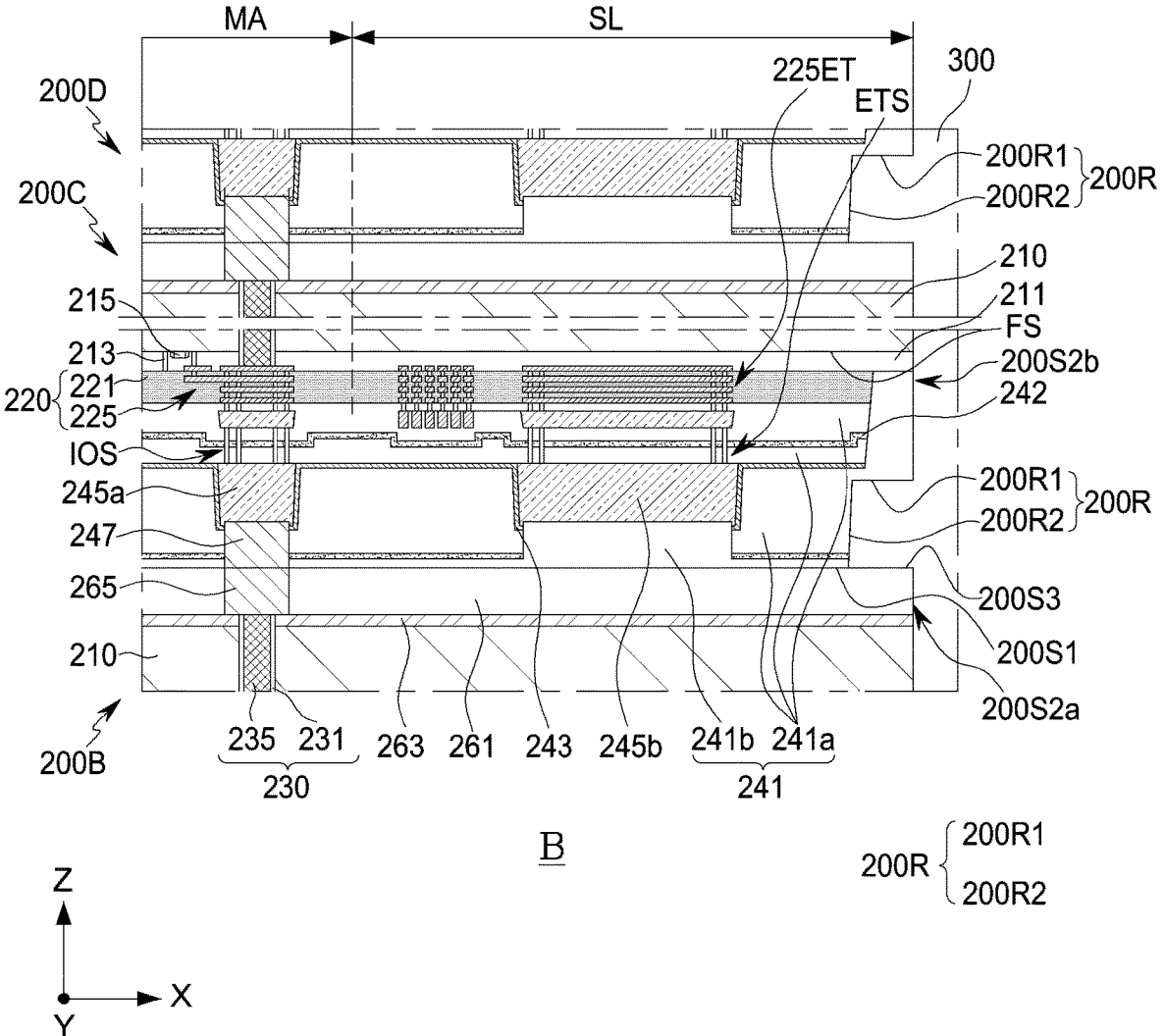
FIG. 2B is a partially enlarged view illustrating a region 'B' of FIG. 2A.

FIG. 2A is a cross-sectional view illustrating a semiconductor package 1*b* according to an example embodiment of the present inventive concept, and FIG. 2B is a partially enlarged view illustrating a region 'B' of FIG. 2A.

Referring to FIGS. 2A and 2B, a semiconductor package 1*b* according to an example embodiment may have the same or similar characteristics as those described with reference to FIGS. 1A to 1C, except that the semiconductor package 1*b* includes a plurality of semiconductor chips 200A, 200B, 200C, and 200D stacked on the base structure 100. For example, the semiconductor package 1*b* of the present embodiment may include direct-bonded semiconductor chips 200A, 200B, 200C, and 200D, and a molding member 300. According to an example embodiment, the number of semiconductor chips 200A, 200B, 200C, and 200D may be provided in a greater or lesser amount than that shown in the drawings. For example, three or less or five or more semiconductor chips may be stacked on the base structure 100.

For example, the base structure 100 may be a buffer chip or a control chip including a plurality of logic devices and/or memory devices. The base structure 100 may transmit a signal from the semiconductor chips 200A, 200B, 200C, and 200D stacked thereabove externally, and also transmit a signal and power from the outside to the semiconductor chips 200A, 200B, 200C, and 200D. The semiconductor chips 200A, 200B, 200C, and 200D may include volatile memory devices such as DRAM and SRAM, or non-volatile memory devices such as PRAM, MRAM, FeRAM, or RRAM. In this case, the semiconductor package 1*b* of the present embodiment may be used for a high bandwidth memory (HBM) product, an electro data processing (EDP) product, or the like.

Since the semiconductor chips 200A, 200B, 200C, and 200D include the same or similar components as the semiconductor chip 200 illustrated in FIGS. 1A to 1C, except that the semiconductor chips 200A, 200B, 200C, and 200D further include a through electrode 230 and an upper connection pad 265 for forming a mutual electrical connection path, reference signs and repeated descriptions for the same components are omitted. The through electrode 230 may include a via plug 235 and a side insulating film 231 surrounding a side surface of the via plug 235. However, unlike the other semiconductor chips 200A, 200B, and 200C, the uppermost semiconductor chip 200D may not include a through electrode 230, and may have a relatively large thickness. In addition, since the through electrode 230, the upper connection pad 265, and the insulating protective layer 263 have the same or similar characteristics as the through electrode 130, the upper pad 165, and the insulating protective layer 163 of the base structure 100 with reference to FIG. 1C, repeated descriptions thereof will be omitted.

Among the semiconductor chips 200A, 200B, 200C, and 200D, an upper insulating layer 261 of the semiconductor chip that is relatively lower and a lower insulating layer 241 of the semiconductor chip that is relatively higher may be coupled while being in contact with each other, and an upper connection pad 255 of the semiconductor chip that is relatively lower and a lower connection pad 247 of the semi-conductor chip that is relatively higher may be coupled while being in contact with each other. Accordingly, the semiconductor chips 200A, 200B, 200C, and 200D may be sequentially stacked while the upper insulating layer 261 and the lower insulating layer 241 are coupled while being in contact with each other and the upper contact pad 255 and the lower connection pad 247 are coupled while being in contact with each other. The lowermost semiconductor chip 200A may be coupled while being in contact with the base structure 100.

For example, the semiconductor package 1b of the present example embodiment may include a first semiconductor chip 200B including a first upper connection pad 265 and a first upper insulating layer 261 surrounding a side surface of the first upper connection pad 265, the first semiconductor chip 200B having a first upper surface 200S3 provided by the first upper insulating layer 261 and the first upper connection pad 265 and a first side surface 200S2a provided by the first upper insulating layer 261; and a second semi-conductor chip 200C including a second lower connection pad 247 on the first upper surface 200S3 of the first semiconductor chip 200B, and including and facing the first upper connection pad 265 and a second lower insulating layer 241 surrounding a side surface of the second lower connection pad 247, and having a second lower surface 200S1 provided by the second lower connection pad 247 and the second lower insulating layer 241, a second side surface 200S2b provided by the second lower insulating layer 241, and a second recess surface 200R extending from one end of the second side surface 200S2b to one end of the second lower surface 200S1. Here, the first semiconductor chip 200B may be understood as a semiconductor chip that is relatively lower, and the second semiconductor chip 200C may be understood as a semiconductor chip that is relatively higher.

The molding member 300 may be on the base structure 100, and may seal at least a portion of each of the semi-conductor chips 200A, 200B, 200C, and 200D. The molding member 300 may be formed to expose an upper surface of an uppermost semiconductor chip 200D. However, accord-ing to example embodiments, the molding member 300 may be formed to cover the upper surface of the uppermost semiconductor chip 200D. The molding member 300 may include, for example, an epoxy mold compound (EMC), but a material of the molding member 300 is not particularly limited thereto.

Figure 3A:
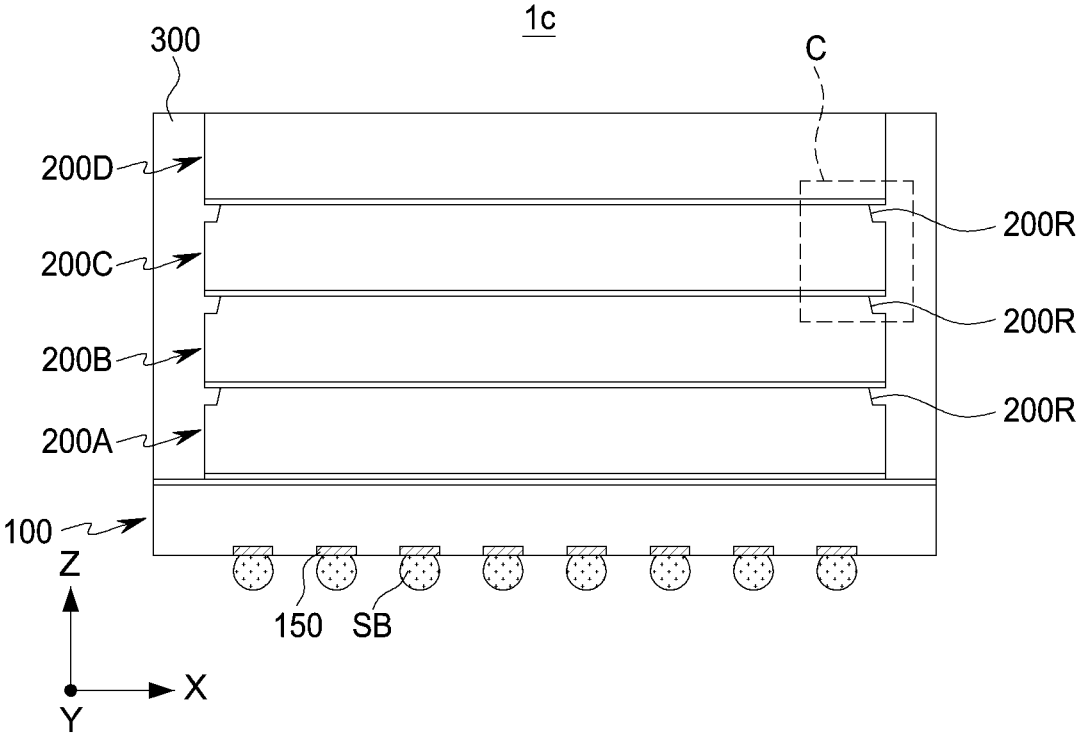
FIG. 3A is a cross-sectional view illustrating a semiconductor package according to an example embodiment of the present inventive concept.
Figure 3B:
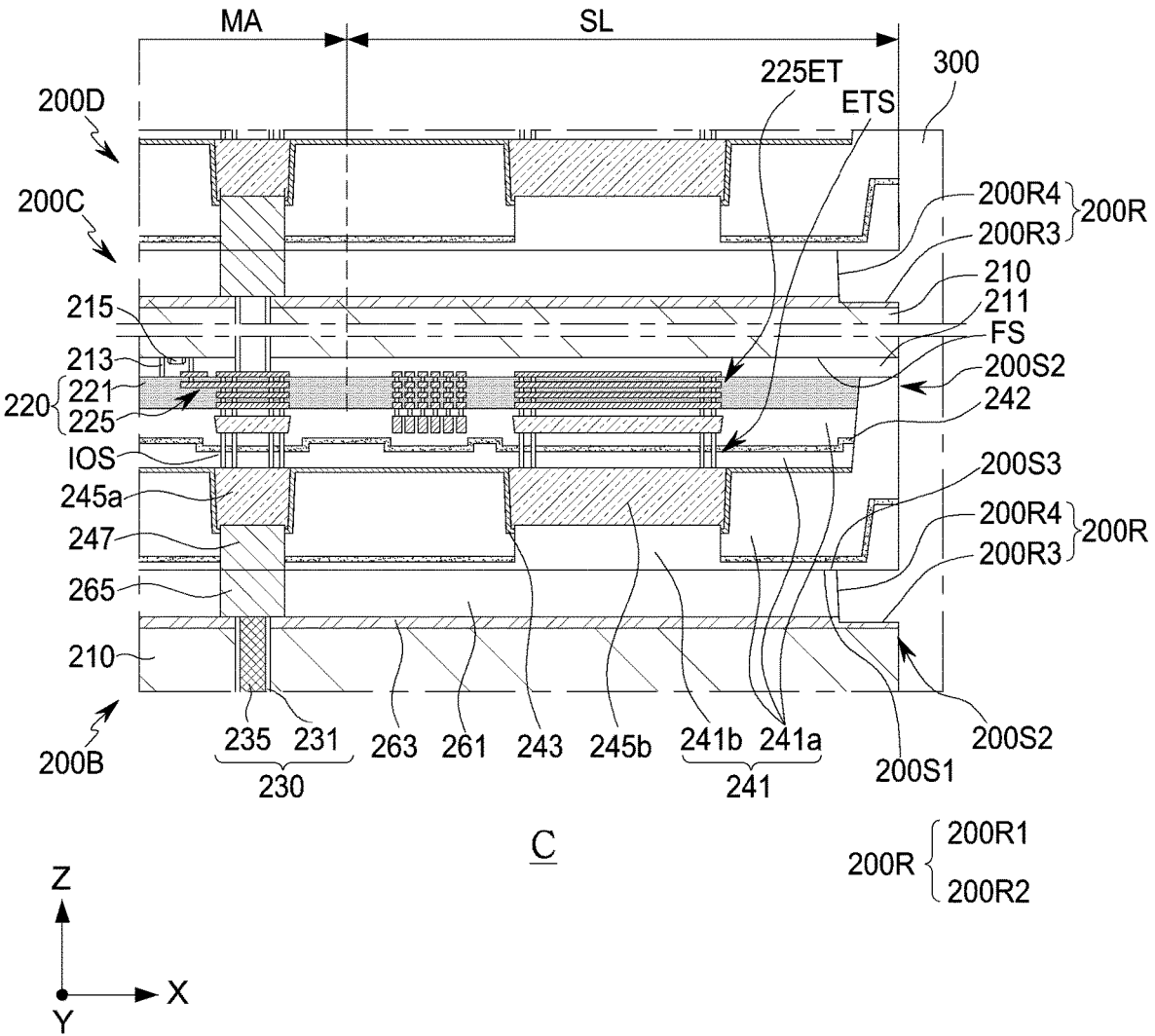
FIG. 3B is a partially enlarged view illustrating a region 'C' of FIG. 3A.

FIG. 3A is a cross-sectional view illustrating a semicon-ductor package 1c according to an example embodiment of the present inventive concept, and FIG. 3B is a partially enlarged view illustrating a region 'C' of FIG. 3A.

Referring to FIGS. 3A and 3B, a semiconductor package 1c according to an embodiment may have the same or similar characteristics as those described with reference to FIGS. 1A to 2B, except that a recess surface 200R is formed above semiconductor chips 200A, 200B, 200C, and 200D. Hereinafter, the lowest second semiconductor chip 200A will be mainly described, and reference numerals and repeated descriptions of the same components will be omit-ted. For example, an upper recess surface 200R (referred to as an "upper" recess surface to distinguish it from the recess surface in FIG. 1A) may extend from one end of a side surface 200S2 of the semiconductor chip 200A to one end of an upper surface 200S3 thereof. The upper recess surface 200R may include a third surface 200R3 extending from one end of the side surface 200S2 of the semiconductor chip 200A and a fourth surface 200R4 extending from one end of the upper surface 200S3 thereof. Similar to the lower recess surface (referred to as a "lower" recess surface to distinguish it from the recess surface of the present example embodi-ment) described with reference to FIG. 1A, and the like, the upper recess surface 200R may be formed to not to expose the substrate 210. The upper recess surface 200R may be provided by at least one of the upper insulating layer 261 or the insulating protective layer 263, and the upper insulating layer 261 or the insulating protective layer 263 may extend between the upper recess surface 200R and the substrate 210. For example, the upper recess surface 200R may be provided by an upper insulating layer 261 and an insulating protective layer 263, and an insulating protective layer 263 may extend between the third surface 200R3 and the sub-strate 210. According to an example embodiment, the upper recess surface 200R may be provided only by the upper insulating layer 261, and in this case, the upper insulating layer 261 and the insulating protective layer 263 and the insulating protective layer 263 may extend between the third surface 200R3 and the substrate 210.

Figure 4A:
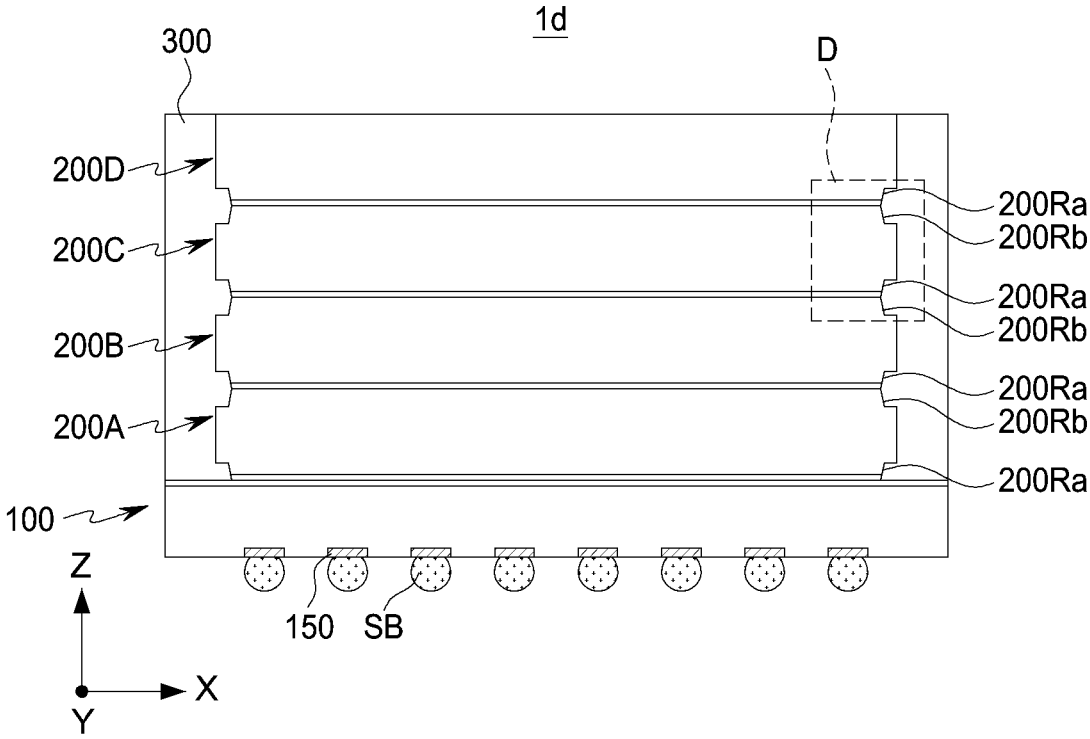
FIG. 4A is a cross-sectional view illustrating a semiconductor package according to an example embodiment of the present inventive concept.
Figure 4B:
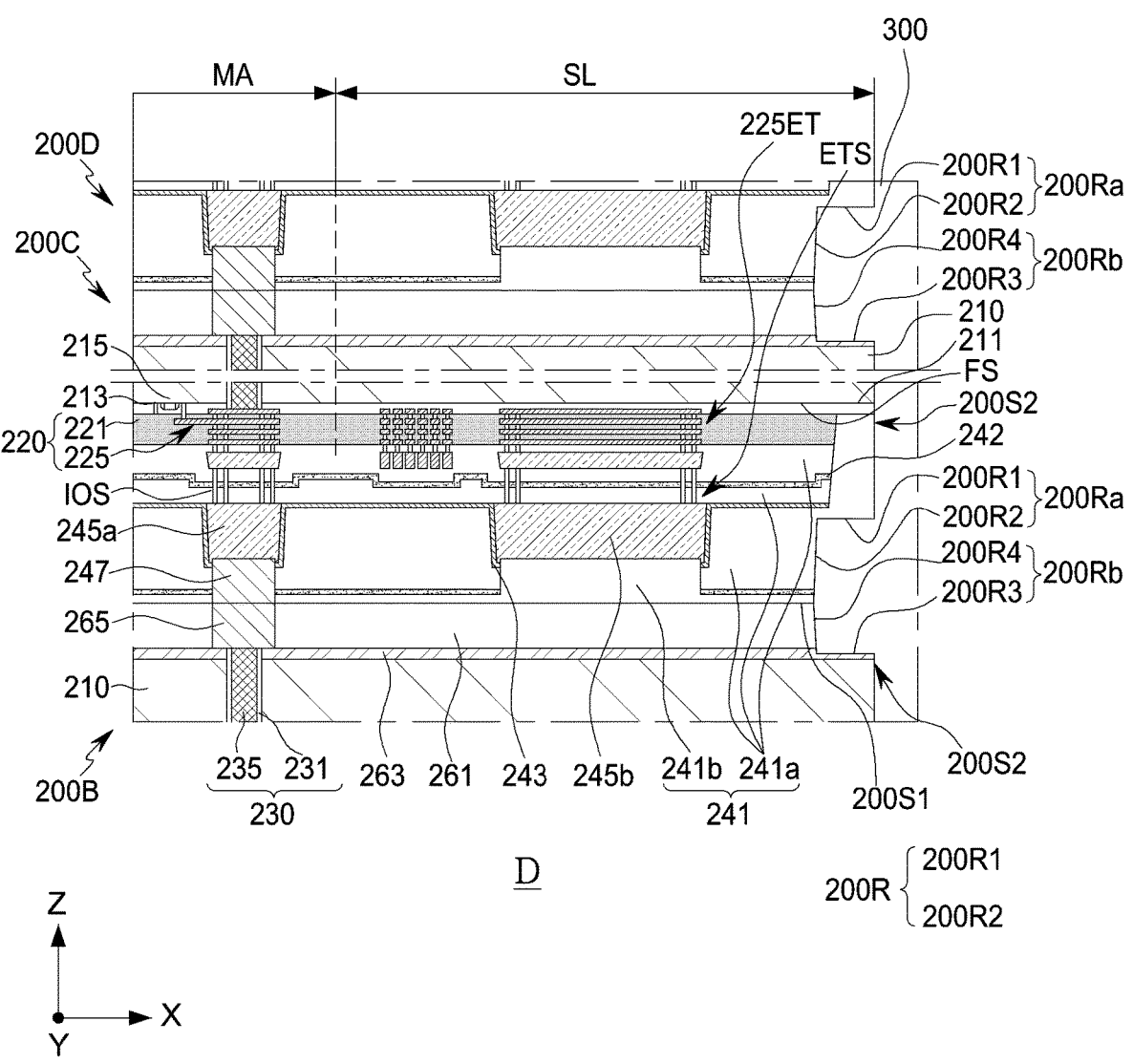
FIG. 4B is a partially enlarged view illustrating a region 'D' of FIG. 4A.

FIG. 4A is a cross-sectional view illustrating a semicon-ductor package 1d according to an example embodiment of the present inventive concept, and FIG. 4B is a partially enlarged view illustrating a region 'D' of FIG. 4A.

Referring to FIGS. 4A and 4B, a semiconductor package 1d according to an example embodiment may have the same or similar characteristics as those described with reference to FIGS. 1A to 3B, except that the semiconductor package 1d includes a lower recess surface 200Ra and an upper recess surface 200Rb. The semiconductor chips 200A, 200B, 200C, and 200D may be bonded and coupled so that an upper recess surface 200Rb of the semiconductor chip that is relatively lower and a lower recess surface 200Ra of the semiconductor chip that is relatively higher face each other. For example, the uppermost semiconductor chip 200D may include only the lower recess surface 200Ra. The lower recess surface 200Ra and the upper recess surface 200Rb may be provided by the lower insulating layer 241 and the upper insulating layer 261, respectively. In this case, a groove surrounded by the lower recess surface 200Ra and the upper recess surface 200Rb may be formed, and a space for accommodating burrs generated in a cutting process of the semiconductor chip 200A may be provided.

Figure 5:
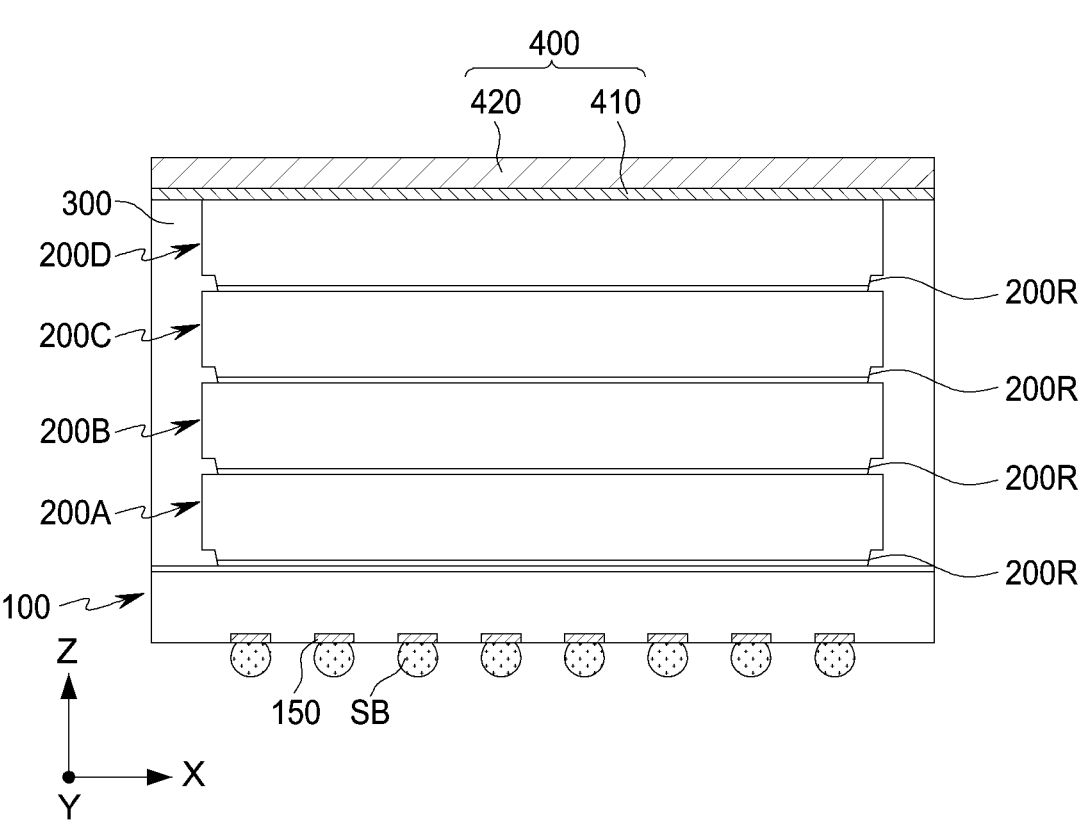
FIG. 5 is a cross-sectional view illustrating a semiconductor package according to an example embodiment of the present inventive concept.

FIG. 5 is a cross-sectional view illustrating a semicon-ductor package 1e according to an example embodiment of the present inventive concept.

Referring to FIG. 5, a semiconductor package 1e of an example embodiment may have the same or similar char-acteristics as those described with reference to FIGS. 1A to 4B, except that the semiconductor package 1e further includes a heat dissipation structure 400 on the semicon-ductor chips 200A, 200B, 200C, and 200D. The heat dissi-pation structure 400 may be on an uppermost semiconductor chip 200D and a heat dissipation member 300, and for example, may contact an upper surface of the uppermost semiconductor chip 200D exposed from the heat dissipation member 300. The heat dissipation structure 400 may include a heat dissipation plate 420 and an adhesive layer 410 for bonding the heat dissipation plate 420 to the uppermost semiconductor chip 200D and the heat dissipation member 300. The heat dissipation plate 420 may include a material having excellent thermal conductivity, for example, aluminum (Al), gold (Au), silver (Ag), copper (Cu), iron (Fe), graphite (Graphite), graphene (Graphene) and the like. The adhesive layer 410 may include, for example, a thermally conductive adhesive tape, thermally conductive grease, thermally conductive adhesive, and the like.

Figure 6:
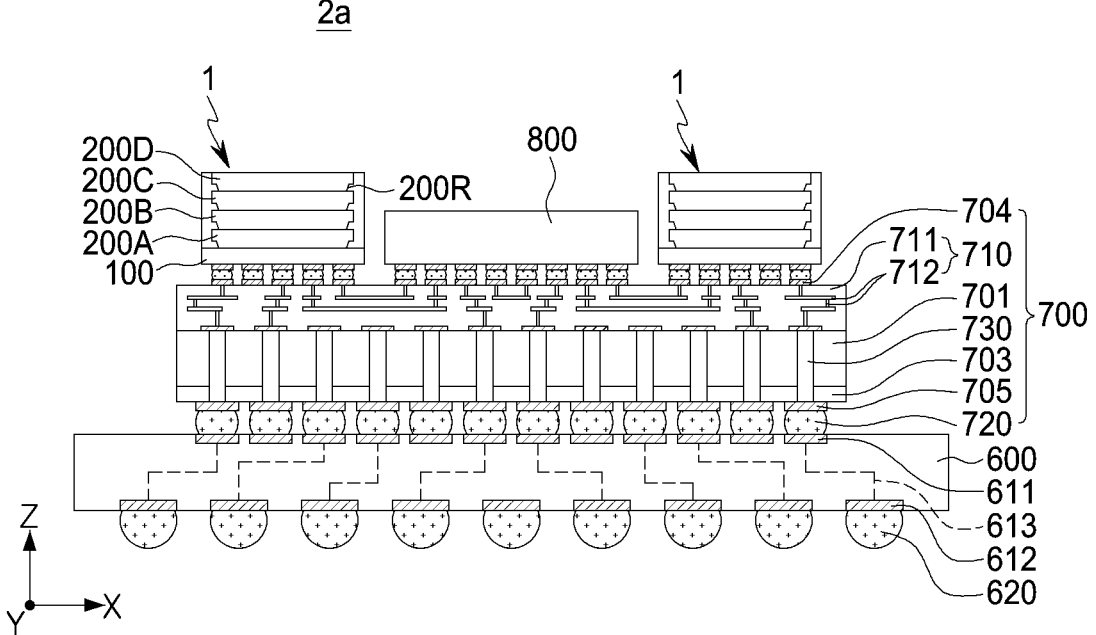
FIG. 6 is a cross-sectional view illustrating a semiconductor package according to an example embodiment of the present inventive concept.

FIG. 6 is a cross-sectional view illustrating a semiconductor package 2a according to an example embodiment of the present inventive concept.

Referring to FIG. 6, a semiconductor package 2a of an example embodiment may include a package substrate 600, an interposer substrate 700, and at least one chip structure 1. In addition, the semiconductor package 2a may further include a logic chip or a processor chip 800 adjacent to the chip structure 1 on the interposer substrate 700. The chip structure 1 The chip structure 1 may have the same or similar characteristics to the semiconductor packages 1a, 1b, 1c, 1d, and 1e described with reference to FIGS. 1A to 5.

The package substrate 600 may be a support substrate on which an interposer substrate 700, a logic chip 800, and a chip structure 1 are mounted, and a substrate for a semiconductor package including a printed circuit board (PCB), a ceramic substrate, a glass substrate, a tape wiring board, and the like. A body of the package substrate 600 may include different materials depending on the type of the substrate. For example, when the package substrate 600 is a printed circuit board, it may be in a form in which a wiring layer is additionally laminated on one or both sides of a body copper clad laminate or a copper clad laminate.

The interposer substrate 700 may include a substrate 701, a lower protective layer 703, a lower pad 705, an interconnection structure 710, a metal bump 720, and a through via 730. The chip structure 1000 and the processor chip 800 may be stacked on the package substrate 600 via the interposer substrate 700. The interposer substrate 700 may electrically connect the chip structure 1000 and the processor chip 800 to each other.

The substrate 701 may be formed of, for example, any one of silicon, an organic material, plastic, and a glass substrate. When the substrate 701 is a silicon substrate, the interposer substrate 700 may be referred to as a silicon interposer, and may be manufactured through the process described with reference to FIGS. 1 to 7. Unlike those illustrate in the drawings, when the substrate 701 is an organic substrate, the interposer substrate 700 may be referred to as a panel interposer.

A lower protective layer 703 may be on a lower surface of the substrate 701, and a lower pad 705 may be on the lower protective layer 703. The lower pad 705 may be connected to the through via 730. The chip structure 1000 and the processor chip 800 may be electrically connected to the package substrate 600 through the metal bumps 720 on the lower pad 705.

The interconnection structure 710 may be on an upper surface of the substrate 701, and may include an interlayer insulating layer 711 and a single-layer or multilayer wiring structure 712. When the interconnection structure 710 has a multilayer wiring structure, wiring patterns of different layers may be connected to each other through contact vias.

The through via 730 may extend from an upper surface to a lower surface of the substrate 701 to extend through the substrate 701. In addition, the through via 730 may extend into the interconnection structure 710 to be electrically connected to wirings of the interconnection structure 710.

When the substrate 701 is silicon, the through via 730 may be referred to as a TSV. According to an example embodiment, the interposer substrate 700 may include only an interconnection structure therein, but may not include a through via.

The interposer substrate 700 may be used for the purpose of converting or transferring an input electrical signal between the package substrate 600 and the chip structure 1 or the processor chip 800. Accordingly, the interposer substrate 700 may not include elements such as active elements or passive elements. Also, according to an example embodiment, the interconnection structure 710 may be below a through via 730. For example, a positional relationship between the interconnection structure 710 and the through via 730 may be relative.

The metal bump 720 may be on a lower surface of the interposer substrate 700 and may be electrically connected to a wiring of the interconnection structure 710. The interposer substrate 700 may be stacked on the package substrate 600 through a metal bump 720 The metal bump 720 may be connected to the lower pad 705 through wirings of the interconnection structure 710 and the through via 730. In one example, a portion of lower pads 705 used for power or ground among the lower pads 705 may be integrated and connected together to the metal bump 720, so that the number of the lower pads 705 may be greater than or equal to the number of the metal bump 720.

The logic chip or processor chip 800 may include, for example, a central processor (CPU), a graphics processor (GPU), a field programmable gate array (FPGA), a digital signal processor (DSP), a cryptographic processor, a microprocessor, a microcontroller, an analog-to-digital converter, an application specific integrated circuit (ASIC), and the like. Depending on the types of devices included in the logic chip 800, the semiconductor package 2a may be referred to as a server-oriented semiconductor package or a mobile-oriented semiconductor package.

Meanwhile, the semiconductor package 2a may further include an internal sealing material covering a side surface and an upper surface of the chip structure 1 and the processor chip 800 on the interposer substrate 700. In addition, the semiconductor package 2a may further include an outer sealing material covering the interposer substrate 700 and the inner sealing material on the package substrate 600. The outer sealing material and the inner sealing material may be formed together and may thus be indistinguishable. According to an example embodiment, the semiconductor package 2a may further include a heat dissipation structure covering the chip structure 1 and the processor chip 800 on the package substrate 600.

FIGS. 7A to 7D are cross-sectional views illustrating a manufacturing process of a semiconductor chip according to a process sequence according to an example embodiment of the present inventive concept. FIGS. 7A to 7D illustrate a manufacturing process of a recess surface or a "lower" recess surface of the semiconductor chip illustrated in FIG. 1A and the like.

Figure 7A:
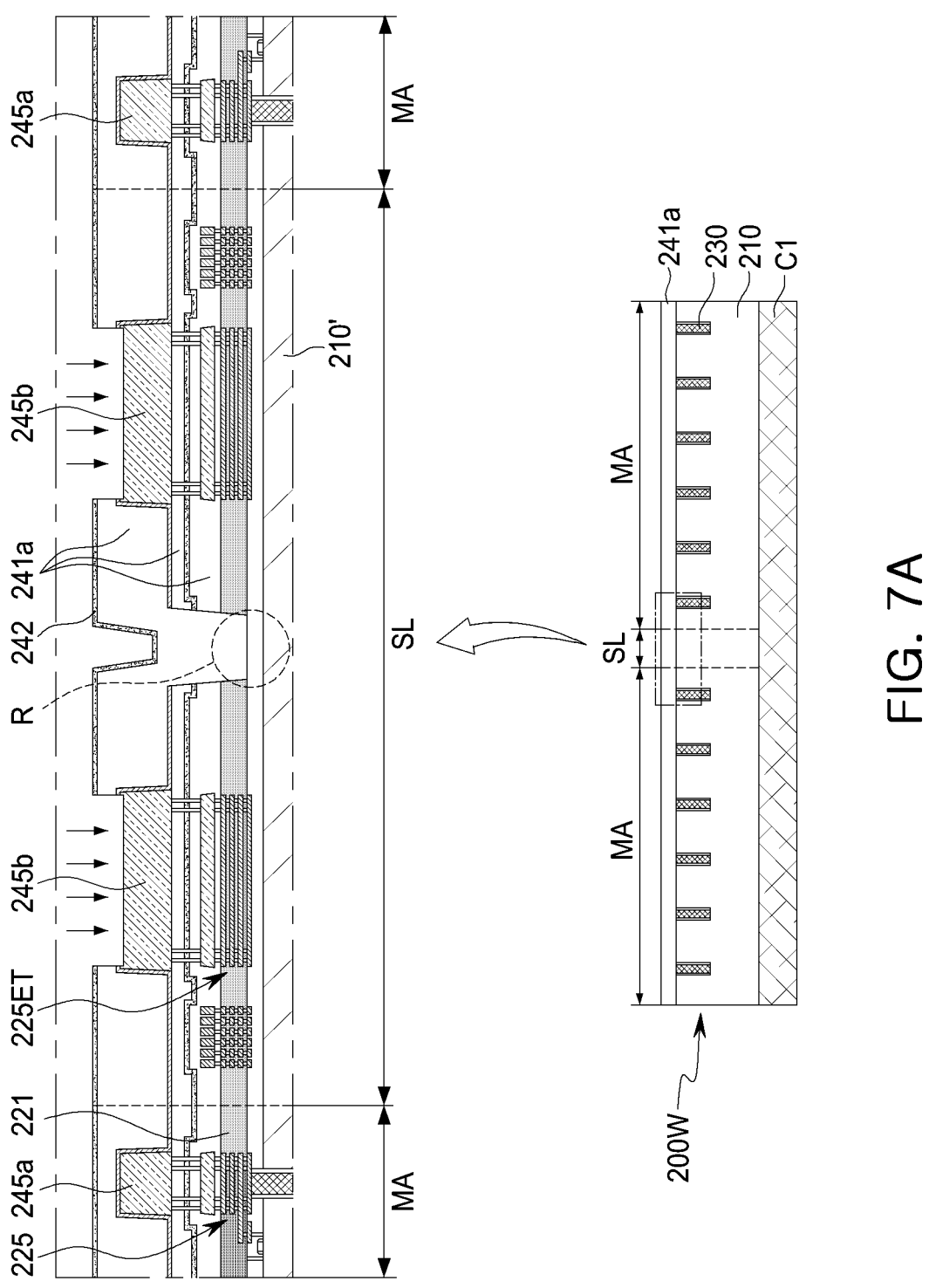
FIGS. 7A to 7D are cross-sectional views illustrating a manufacturing process of a semiconductor chip according to a process sequence according to an example embodiment of the present inventive concept.

Referring to FIG. 7A, an electrical test may be performed using a test pad 245b of a semiconductor wafer 200W. The semiconductor wafer 200W may be adhered to a first carrier C1, which may be in a state in which components for semiconductor chips may be implemented. For example, the semiconductor wafer 200W may include a wiring structure 225, a low dielectric layer 221, an input/output pad 245a, a test pad 245b, a first lower insulating layer 241a, and the like, on a preliminary substrate 210' before a thickness is adjusted by a backgrinding process. Here, the input/output pad 245*a* may be located in a main region MA, and the test pad 245*b* may be located in a scribe lane SL. The first lower insulating layer 241*a* may extend to cut the low dielectric layer 221 in a partial region R of the scribe lane SL. The electrical test of the semiconductor wafer 200W may be performed by etching a portion of the first lower insulating layer 241*a* to expose the test pad 245*b*. After the electrical test, a pile-up on a surface of the test pad 245*b* may be removed to prevent undulation of the second lower insulating layer 241*b* to be formed later.

Figure 7B:
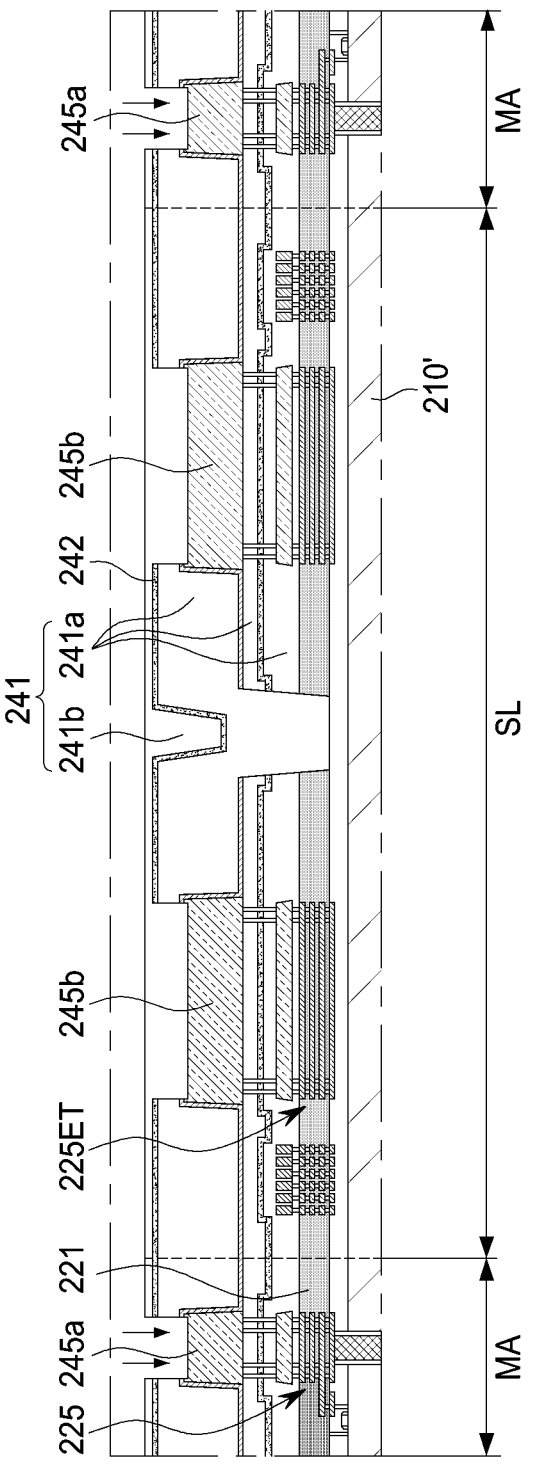

Referring to FIG. 7B, a second lower insulating layer 241*b* may be formed and processed to expose the input/output pad 245*a*. The second lower insulating layer 241*b* may include a silicon oxide, but an embodiment thereof is not limited thereto. According to an example embodiment, the second lower insulating layer 241*b* may include at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC). An interface between the first lower insulating layer 241*a* and the second lower insulating layer 241*b* may not be clearly distinguished.

Figure 7C:
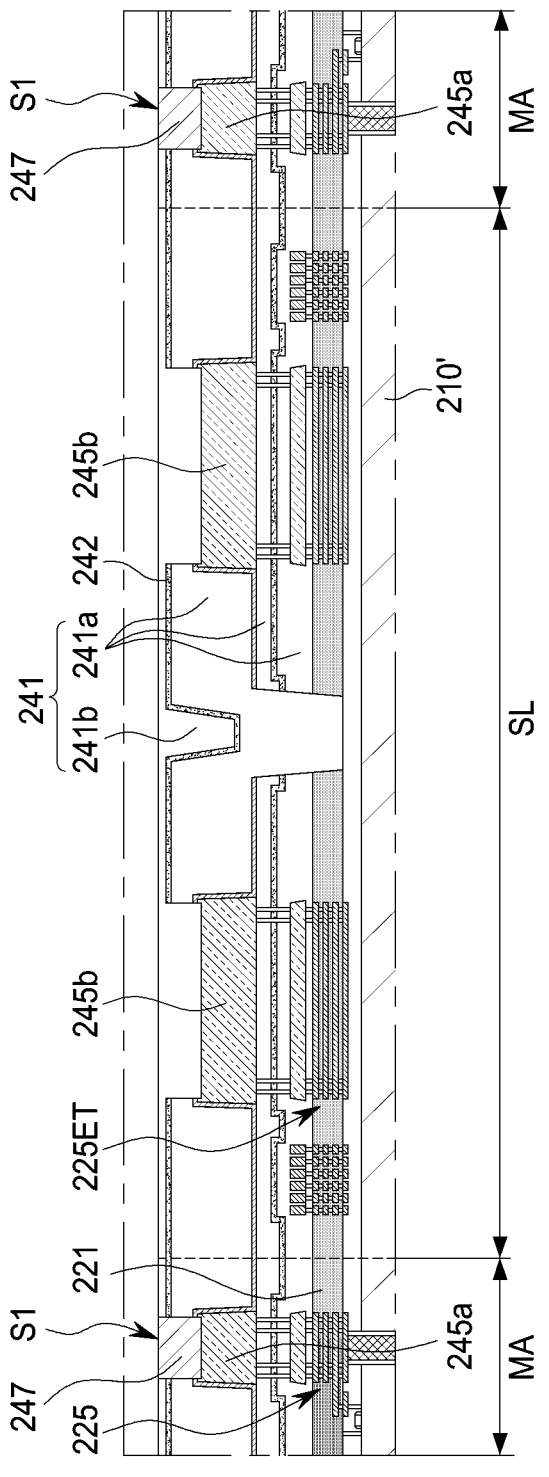

Referring to FIG. 7C, a lower connection pad 247 may be formed on the input/output pad 245*a*. The lower connection pad 247 may be formed by filling an opening of the lower insulating layer 241 with a metal such as copper (Cu) using a plating process. The lower connection pad 247 may be formed to be coplanar with the lower insulating layer 241 by performing a planarization process such as a chemical mechanical polishing (CMP) process after the plating process. That is, an upper surface of the lower connection pad 247 and an upper surface of the lower insulating layer 241 may provide a first planar surface S1.

Figure 7D:
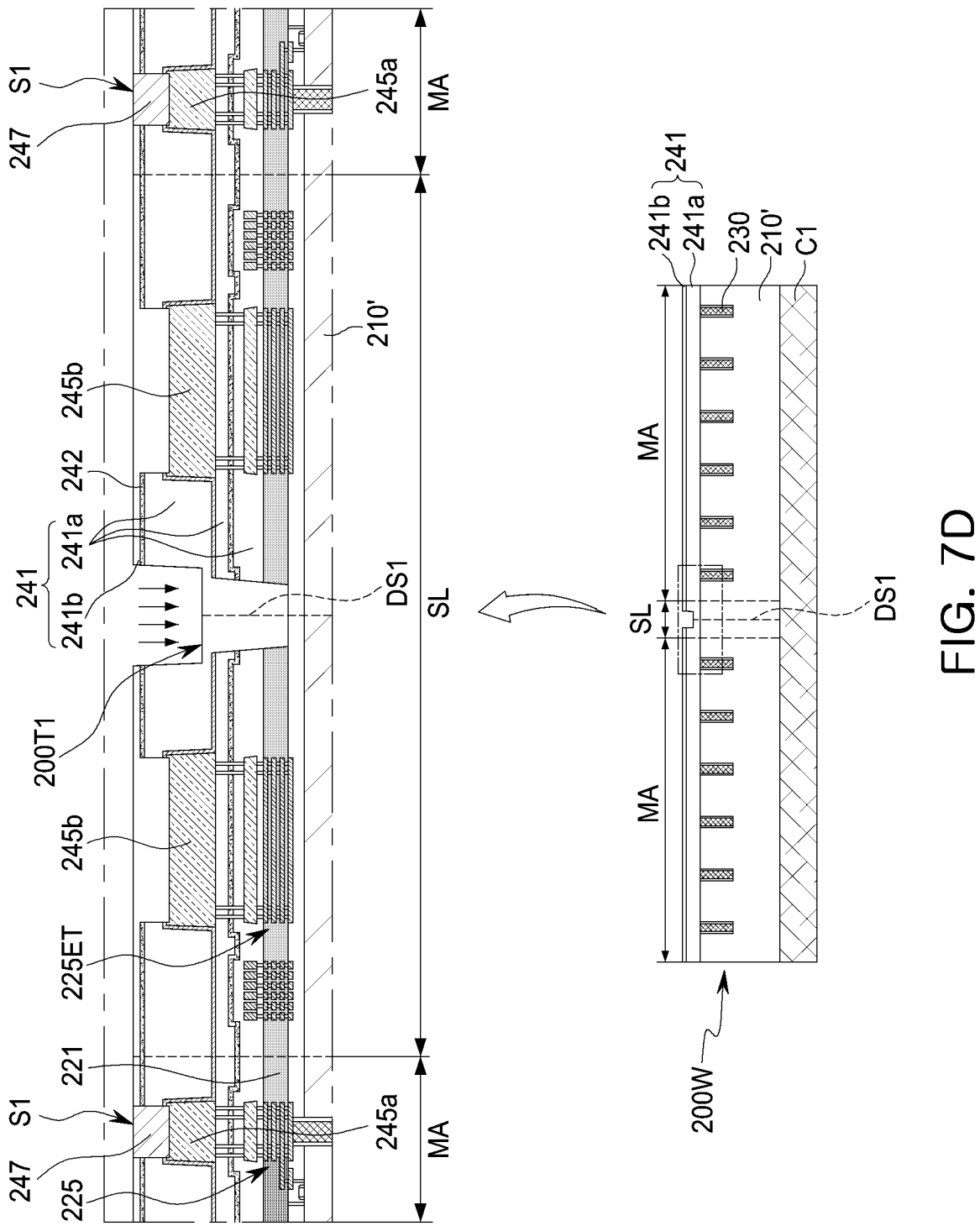

Referring to FIG. 7D, a first trench 200T1 may be formed by processing a lower insulating layer 241. The second trench 200T1 may be formed by etching the lower insulating layer 241, and may have a shape (e.g., trapezoid) in which a width thereof toward a lower portion decreases. The lower insulating layer 241 extending through the low dielectric layer 221 may be below the first trench 200T1. The first trench 200T1 may have a predetermined depth so that burrs generated in a dicing process of the semiconductor wafer 200W for cutting a first dividing surface DS1 do not protrude onto a first planar surface S1. For example, the first trench 200T1 may have a depth of about 5 μm or more. Also, the first trench 200T1 may have a width greater than a width of the first dividing surface DS1 removed in the dicing process. In the drawing, although the first dividing section DS1 is illustrated by a dotted line, it can be understood as a region having a predetermined volume in consideration of the region removed in the dicing process. The first trench 200T1 may provide a recess surface (or a "lower" recess surface) of the semiconductor chip after the dicing process of the semiconductor wafer 200W.

FIGS. 8A to 8D are cross-sectional views illustrating a manufacturing process of a semiconductor chip according to an example embodiment of the present inventive concept. FIGS. 8A to 8D illustrate the manufacturing process of the recess surface or "upper" recess surface of the semiconductor chip shown in FIG. 3A and the like.

Figure 8A:
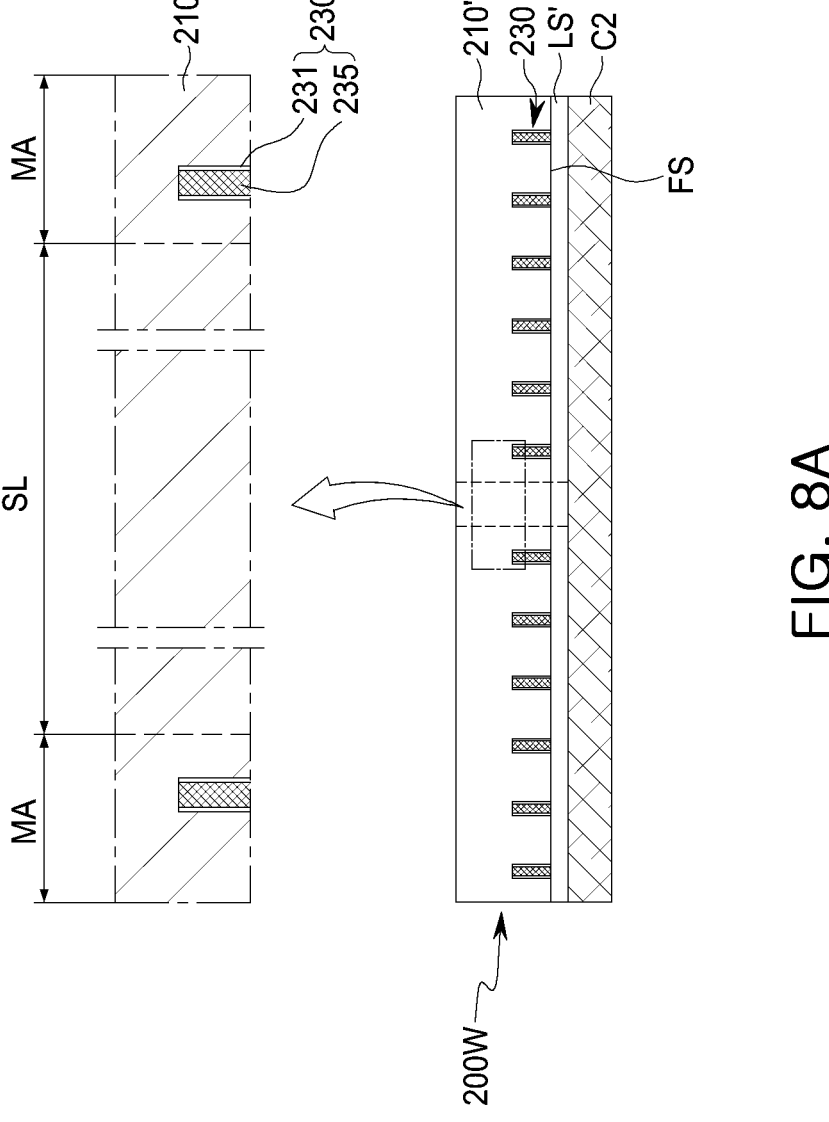
FIGS. 8A to 8D are cross-sectional views illustrating a manufacturing process of a semiconductor chip according to a process sequence according to an example embodiment of the present inventive concept.

Referring to FIG. 8A, a semiconductor wafer 200W on which a front structure layer LS' is formed may be temporarily bonded to a second carrier C2. The semiconductor wafer 200W may be stably supported on the second carrier C2 during a subsequent process by an adhesive material layer such as glue. The semiconductor wafer 200W may be positioned such that a front surface FS of a preliminary substrate 210' faces the second carrier C2. The front structure layer LS' may be formed through the processes of FIGS. 7A to 7D. According to an example embodiment, the front structural layer LS' may not include a recess surface.

Figure 8B:
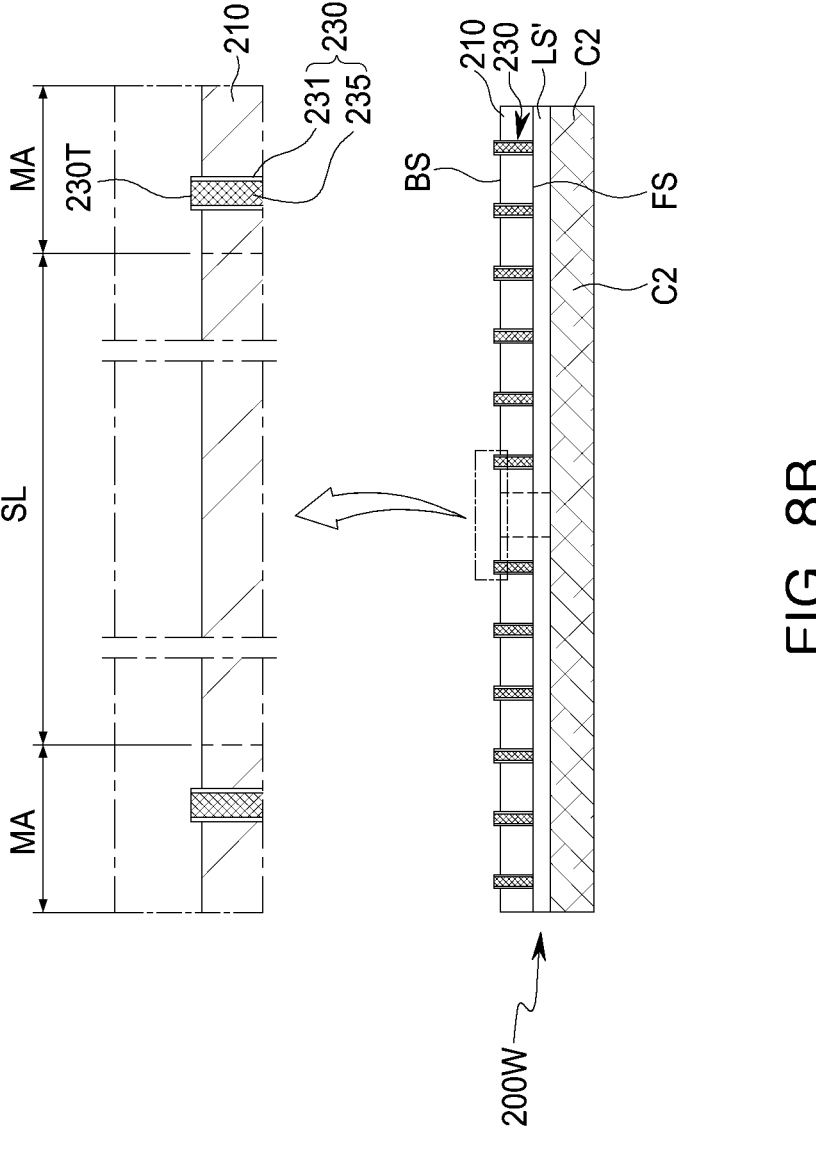

Referring to FIG. 8B, a thickness of the semiconductor wafer 200W may be reduced by applying a polishing process to an upper surface (an inactive surface) of the semiconductor wafer 200W. As a portion of the preliminary substrate 210' of FIG. 8A is removed, an upper end 230T of a through electrode 230 may protrude from a rear surface BS of the substrate 210. The polishing process may be a CMP process, an etch-back process, or a combination thereof. For example, a CMP process may be performed to reduce a predetermined thickness of the semiconductor wafer 200W, and an etch-back having an appropriate condition may be applied to sufficiently expose the through electrode 230.

Figure 8C:
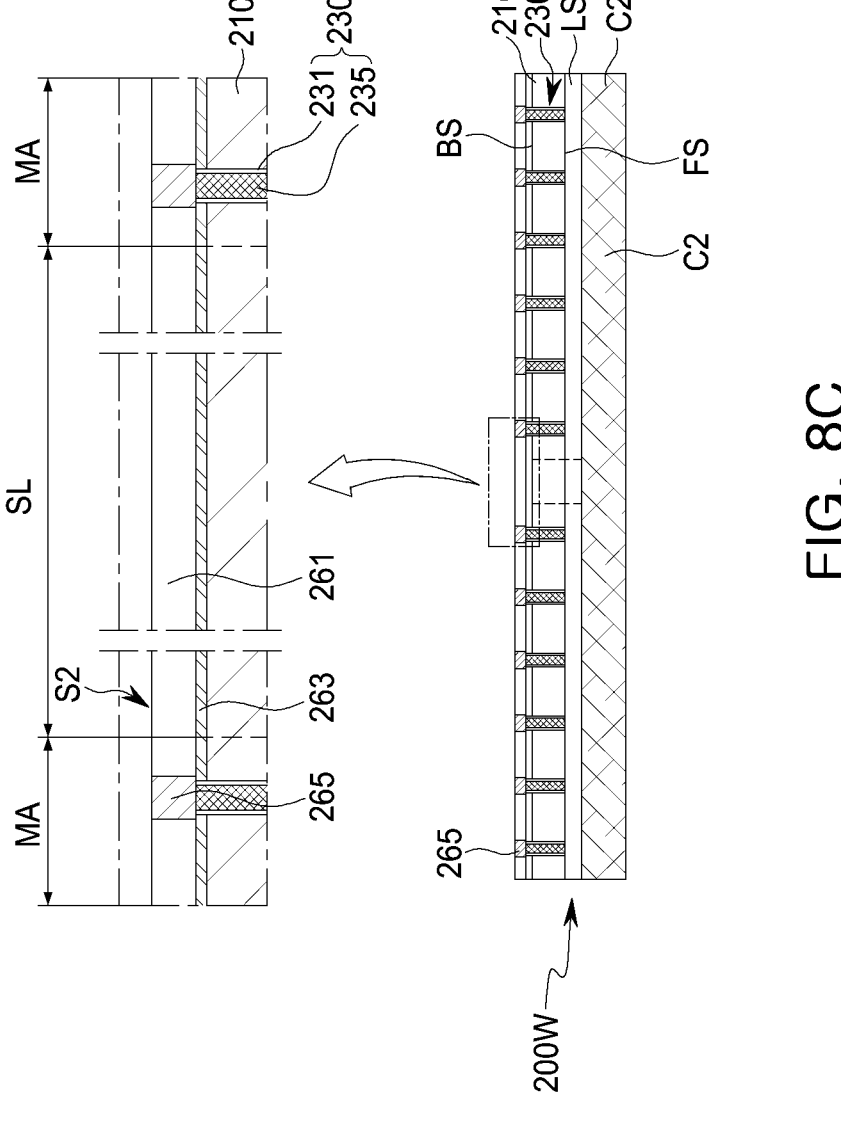

Referring to FIG. 8C, an insulating protective layer 263, an upper insulating layer 261, and an upper connection pad 265 may be sequentially formed on the rear surface BS of the substrate 210. The insulating protective layer 263 may be a silicon oxide. In some example embodiments, a buffer film including a silicon nitride or a silicon oxynitride may be formed above the insulating protective layer 263. The upper insulating layer 261 may include a silicon oxide, but an embodiment thereof is not limited thereto. The upper connection pad 265 may be formed to be coplanar with the upper insulating layer 261 through a plating process and a planarization process. That is, an upper surface of the upper connection pad 265 and an upper surface of the upper insulating layer 261 may provide a second planar surface S2.

Figure 8D:
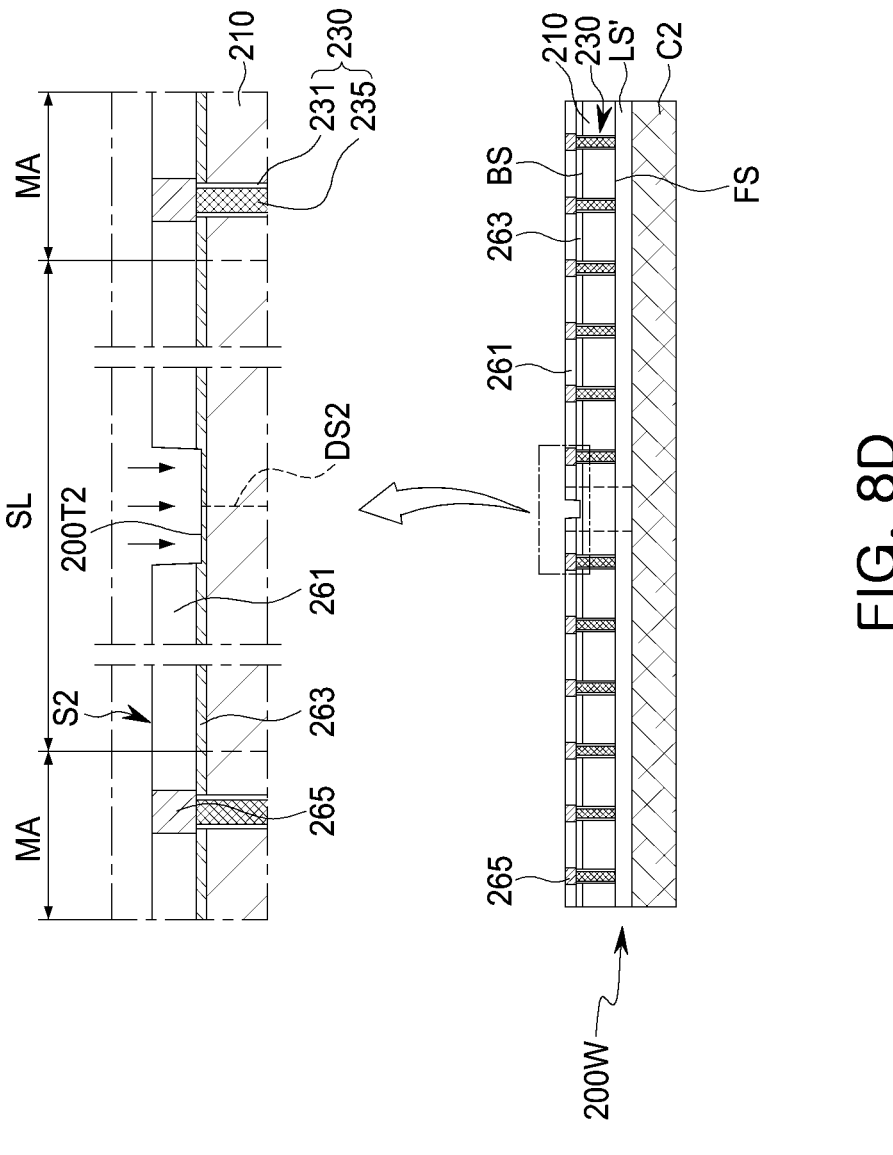

Referring to FIG. 8D, a second trench 200T2 may be formed by processing an upper insulating layer 261. For example, the second trench 200T2 may be formed by etching the upper insulating layer 261 and the insulating protective layer 263, and may have a shape (e.g., trapezoid) in which a width thereof toward a lower portion decreases. The second trench 200T2 may be formed to a depth in which the rear surface BS of the substrate 210 is not exposed. The second trench 200T2 may have a predetermined depth so that burrs generated in a dicing process of the semiconductor wafer 200W for cutting a second dividing surface DS2 do not protrude onto the second planar surface S2. In addition, the second trench 200T2 may have a width greater than a width of the second dividing surface DS2 removed in the dicing process. In the drawing, although the second dividing section DS2 is illustrated by a dotted line, it can be understood as a region having a predetermined volume in consideration of the region removed in the dicing process. The second trench 200T2 may provide a recess surface (or an "upper" recess surface) of the semiconductor chip after the dicing process of the semiconductor wafer 200W.

Figure 9:
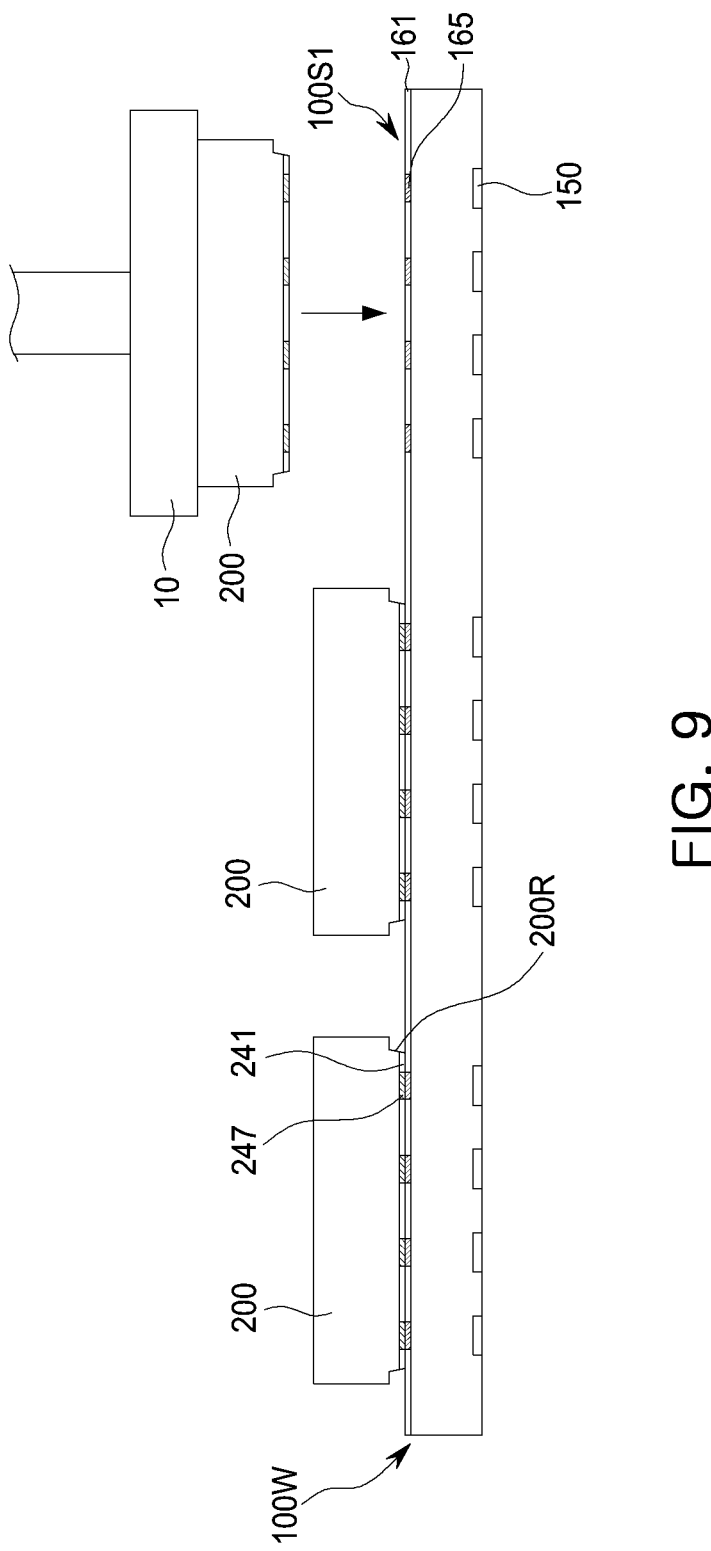
FIG. 9 is a cross-sectional view illustrating a manufacturing process of a semiconductor package according to an example embodiment of the present inventive concept.

FIG. 9 is a cross-sectional view illustrating a manufacturing process of a semiconductor package according to an example embodiment of the present inventive concept.

Referring to FIG. 9, a semiconductor chip 200 may be on a base wafer 100W. The base wafer 100W may include components for the base structure 100 of FIG. 1A. The semiconductor chip 200 may be on the base wafer 100W using a pick-and-place device 10. A lower surface of the semiconductor chip 200 provided by the lower insulating layer 241 and the lower connection pad 247 and an upper surface of the base structure 100 provided by the upper insulating layer 161 and the upper pad 165 may be bonded to each other. Since the semiconductor chip 200 includes a recess surface 200R, a planar lower surface in which burrs do not protrude may be provided. The lower insulating layer

241 and the upper insulating layer 161, and the lower connection pad 247 and the upper connection pad 165 may be subjected to pressure in a temperature atmosphere, higher than room temperature, for example, in a thermal atmosphere of about 200° C. to about 300° C. and bonded and coupled with each other. Here, a temperature of the thermal atmosphere is not limited to about 200° C. to about 300° C., and may be variously changed.

As set forth above, according to example embodiments of the present inventive concept, a semiconductor chip having a reduced burr protruding onto a bonding surface, and a semiconductor package in which void defects are minimized and yield is improved may be provided.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to a direction opposite to the direction. However, these directions are defined for convenience of explanation, and the claims are not limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package, comprising:
a base structure including a body, an upper pad on the body, and an upper insulating layer on a side surface of the upper pad, the base structure having a planar upper surface provided by the upper insulating layer and the upper pad; and
a semiconductor chip on the planar upper surface of the base structure, and including a substrate, a wiring structure below the substrate, a low dielectric layer on a side surface of the wiring structure, a lower connection pad below the wiring structure, and a lower insulating layer on a side surface of the lower connection pad, the semiconductor chip having a planar lower surface provided by the lower insulating layer and the lower connection pad, wherein a side surface of the semiconductor chip is provided by the lower insulating layer and the substrate, and a recess surface of the semiconductor chip extends from one end of the side surface of the semiconductor chip to one end of the planar lower surface,
wherein the low dielectric layer is spaced apart from the recess surface of the semiconductor chip by the lower insulating layer,
wherein the lower insulating layer is divided into a first lower insulating layer and a second lower insulating layer,
wherein the first lower insulating layer extends from an edge of the semiconductor chip along a side surface of the low dielectric layer to be in contact with an interlayer insulating film on the substrate, and
wherein the second lower insulating layer is on the first lower insulating layer and has a planar surface that provides the planar lower surface of the semiconductor chip.

2. The semiconductor package of claim 1, wherein the low dielectric layer is spaced apart from the side surface of the semiconductor chip by the lower insulating layer.

3. The semiconductor package of claim 1, wherein the recess surface comprises a first surface extending from the one end of the side surface of the semiconductor chip in a direction parallel to the planar lower surface, and a second surface extending from the one end of the planar lower surface to the first surface.

4. The semiconductor package of claim 3, wherein the first surface and the second surface are planar surfaces.

5. The semiconductor package of claim 3, wherein the second surface has an angle of about 90 degrees or more with respect to the first surface.

6. The semiconductor package of claim 3, wherein a distance, spaced apart from the planar lower surface of the semiconductor chip to the first surface, is about 5 μm or more.

7. The semiconductor package of claim 1, wherein the lower insulating layer is configured to extend along the side surface of the low dielectric layer and the lower insulating layer is in contact with the interlayer insulating film on the substrate.

8. The semiconductor package of claim 1, wherein the semiconductor chip further comprises a test wiring structure below the substrate, and the low dielectric layer is on a side surface of the test wiring structure, and a test pad is below the test wiring structure.

9. The semiconductor package of claim 8, wherein the test wiring structure is between the side surface of the semiconductor chip and the wiring structure.

10. The semiconductor package of claim 8, wherein a lower surface of the test pad is on the lower insulating layer.

11. The semiconductor package of claim 8, wherein the semiconductor chip further comprises an input/output pad between the wiring structure and the lower connection pad and the lower insulating layer is on a side surface of the input/output pad,
wherein the input/output pad and the test pad are positioned at substantially a same level.

12. The semiconductor package of claim 1, wherein the upper insulating layer and the lower insulating layer comprise silicon oxide or silicon carbonitride.

13. The semiconductor package of claim 1, wherein the low dielectric layer comprises a material having a lower dielectric constant than that of the lower insulating layer.

14. The semiconductor package of claim 1, wherein the base structure further comprises a lower pad below the body, a through electrode electrically connecting the lower pad and the upper pad through the body, and an insulating protective layer between the body and the upper insulating layer.

15. A semiconductor package, comprising:
a base structure including an upper pad and an upper insulating layer on a side surface of the upper pad; and
a semiconductor chip on the base structure, the semiconductor chip including a substrate, a wiring structure below the substrate, a low dielectric layer on a side surface of the wiring structure, a lower connection pad below the wiring structure, and a lower insulating layer on a side surface of the lower connection pad, the semiconductor chip having a lower surface provided by the lower insulating layer and the lower connection pad, wherein a side surface of the semiconductor chip is provided by the lower insulating layer and the substrate, and a recess surface of the semiconductor chip extends from one end of the side surface of the semiconductor chip to one end of the lower surface,
wherein the recess surface includes a first surface recessed in a direction from the lower surface toward the substrate and a second surface extending from the one end of the lower surface to the first surface,
wherein the lower insulating layer extends between the first surface and the substrate,
wherein the lower insulating layer is divided into a first lower insulating layer and a second lower insulating layer,
wherein the first lower insulating layer extends from an edge of the semiconductor chip along a side surface of the low dielectric layer to be in contact with an interlayer insulating film on the substrate, and
wherein the second lower insulating layer is on the first lower insulating layer and has a planar surface that provides the lower surface of the semiconductor chip.

16. The semiconductor package of claim 15, wherein the first surface and the second surface are provided by the lower insulating layer.

17. The semiconductor package of claim 15, wherein the low dielectric layer is not exposed on the side surface and the recess surface of the semiconductor chip.

18. A semiconductor package, comprising:
a first semiconductor chip including a first substrate, an upper connection pad on the first substrate, and an upper insulating layer on a side surface of the first upper connection pad, the first semiconductor chip having an upper surface provided by the upper insulating layer and the upper connection pad and a first side surface provided by the upper insulating layer; and
a second semiconductor chip on the upper surface of the first semiconductor chip, and including a second substrate, a lower connection pad below the second substrate and facing the upper connection pad, a lower insulating layer on a side surface of the lower connection pad, the second semiconductor chip having a second lower surface provided by the lower connection pad and the lower insulating layer, a second side surface provided by the lower insulating layer, and a lower recess surface extending from one end of the second side surface to one end of the lower surface,
wherein the lower recess surface is spaced apart from the second substrate,
wherein the lower insulating layer is divided into a first lower insulating layer and a second lower insulating layer,
wherein the first lower insulating layer extends from an edge of the second semiconductor chip along a side surface of the low dielectric layer to be in contact with an interlayer insulating film on the second substrate, and
wherein the second lower insulating layer is on the first lower insulating layer and has a planar surface that provides the lower surface of the second semiconductor chip.

19. The semiconductor package of claim 18, wherein the first semiconductor chip has an upper recess surface extending from one end of the first side surface to one end of the first upper surface,
wherein the upper recess surface faces the lower recess surface.

20. The semiconductor package of claim 19,
wherein the first semiconductor chip further comprises an insulating protective layer between the first substrate and the upper insulating layer,
wherein the upper insulating layer and the insulating protective layer extends between the upper recess surface and the first substrate, and the upper recess surface is provided by the upper insulating layer and the insulating protective layer.

* * * * *